(12) United States Patent
Kao et al.

(10) Patent No.: US 12,426,347 B2
(45) Date of Patent: Sep. 23, 2025

(54) MULTI-GATE TRANSISTOR CHANNEL HEIGHT ADJUSTMENT

(71) Applicant: Taiwan Semiconductor Manufacturing Company, Ltd., Hsin-Chu (TW)

(72) Inventors: Pei-Ling Kao, Tainan (TW); You-Ting Lin, Miaoli County (TW); Chih-Chung Chang, Nantou County (TW); Jiun-Ming Kuo, Taipei (TW); Yuan-Ching Peng, Hsinchu (TW)

(73) Assignee: Taiwan Semiconductor Manufacturing Company Ltd., Hsinchu (TW)

( * ) Notice: Subject to any disclaimer, the term of this patent is extended or adjusted under 35 U.S.C. 154(b) by 504 days.

(21) Appl. No.: 17/736,454

(22) Filed: May 4, 2022

(65) Prior Publication Data
US 2023/0017945 A1    Jan. 19, 2023

Related U.S. Application Data

(60) Provisional application No. 63/219,903, filed on Jul. 9, 2021.

(51) Int. Cl.
*H10D 84/03* (2025.01)
*H01L 21/02* (2006.01)
(Continued)

(52) U.S. Cl.
CPC ....... *H10D 84/038* (2025.01); *H01L 21/0259* (2013.01); *H01L 21/31111* (2013.01);
(Continued)

(58) Field of Classification Search
CPC ........... H01L 21/0259; H01L 21/31111; H01L 21/31155; H01L 21/32; H01L 21/823807;
(Continued)

(56) References Cited

U.S. PATENT DOCUMENTS 8,796,666 B1    8/2014  Huang et al.
8,815,712 B2    8/2014  Wan et al.
(Continued)

FOREIGN PATENT DOCUMENTS

DE        10008953 A1 *  9/2001  ....... H01L 21/76804
KR     20210038810 A        4/2021
TW        201913756 A        4/2019

*Primary Examiner* — Steven B Gauthier
*Assistant Examiner* — Alvin L Lee
(74) *Attorney, Agent, or Firm* — HAYNES AND BOONE, LLP

(57) ABSTRACT

A method includes providing a semiconductor substrate having a first region and a second region, epitaxially growing a semiconductor layer above the semiconductor substrate, patterning the semiconductor layer to form a first fin in the first region and a second fin in the second region, and depositing a dielectric material layer on sidewalls of the first and second fins. The method also includes performing an anneal process in driving dopants into the dielectric material layer, such that a dopant concentration in the dielectric material layer in the first region is higher than that in the second region, and performing an etching process to recess the dielectric material layer, thereby exposing the sidewalls of the first and second fins. A top surface of the recessed dielectric material layer in the first region is lower than that in the second region.

20 Claims, 32 Drawing Sheets

(51) Int. Cl.
*H01L 21/311* (2006.01)
*H01L 21/3115* (2006.01)
*H01L 21/32* (2006.01)
*H01L 21/324* (2006.01)
*H10D 30/01* (2025.01)
*H10D 30/60* (2025.01)
*H10D 30/67* (2025.01)
*H10D 62/10* (2025.01)
*H10D 64/01* (2025.01)
*H10D 84/01* (2025.01)
*H10D 84/85* (2025.01)

(52) U.S. Cl.
CPC .. *H01L 21/31116* (2013.01); *H01L 21/31155* (2013.01); *H01L 21/32* (2013.01); *H01L 21/324* (2013.01); *H10D 30/031* (2025.01); *H10D 30/611* (2025.01); *H10D 30/6735* (2025.01); *H10D 30/6757* (2025.01); *H10D 62/118* (2025.01); *H10D 64/017* (2025.01); *H10D 84/0167* (2025.01); *H10D 84/0188* (2025.01); *H10D 84/85* (2025.01); *H10D 30/024* (2025.01); *H10D 84/0193* (2025.01)

(58) Field of Classification Search
CPC ............... H01L 27/092; H01L 29/0665; H01L 29/42392; H01L 29/66545; H01L 29/66742; H01L 29/7831; H01L 29/78696; H01L 21/823821; H01L 21/823878

See application file for complete search history.

(56) References Cited

U.S. PATENT DOCUMENTS

| | | |
|---|---|---|
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,962,400 B2 | 2/2015 | Tsai et al. |
| 8,963,258 B2 | 2/2015 | Yu et al. |
| 9,093,514 B2 | 7/2015 | Tsai et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,245,805 B2 | 1/2016 | Yeh et al. |
| 9,520,482 B1 | 12/2016 | Chang et al. |
| 9,548,303 B2 | 1/2017 | Lee et al. |
| 9,576,814 B2 | 2/2017 | Wu et al. |
| 2012/0256268 A1* | 10/2012 | Li ..................... H01L 21/76232 438/424 |
| 2013/0285116 A1 | 10/2013 | Lochtefeld et al. |
| 2015/0187634 A1* | 7/2015 | Chiang ................ H10D 84/834 438/433 |
| 2016/0049489 A1* | 2/2016 | Wan ..................... H10D 64/017 438/157 |
| 2018/0061717 A1* | 3/2018 | Wang ................ H01L 21/31111 |
| 2020/0044087 A1* | 2/2020 | Guha ............. H01L 21/823821 |

* cited by examiner

MULTI-GATE TRANSISTOR CHANNEL HEIGHT ADJUSTMENT

PRIORITY DATA

This application claims priority to U.S. Provisional Patent Application No. 63/219,903, filed on Jul. 9, 2021, entitled "Multi-gate Transistor Channel Height Adjustment", the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as IC technologies progress towards smaller technology nodes, multi-gate metal-oxide-semiconductor field effect transistors (multi-gate MOSFETs, or multi-gate transistors) have been introduced to improve gate control by increasing gate-channel coupling, reducing off-state current, and reducing short-channel effects (SCEs). A multi-gate device generally refers to a device having a gate structure (also known as gate stack), or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate structure on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor.

In the formation of multi-gate transistors, shallow trench isolation (STI) regions are formed to separate adjacent transistors. Various etch back and cleaning steps during the formation of the STI regions may cause recess of the top surfaces of the STI regions. The center portions of the top surfaces of the STI regions may be lower than edge portions of the top surfaces of the STI regions. The STI regions with such a top surface profile may impact the performance of the multi-gate transistors. Therefore, while existing multi-gate transistors are generally adequate for their intended purposes, they are not satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
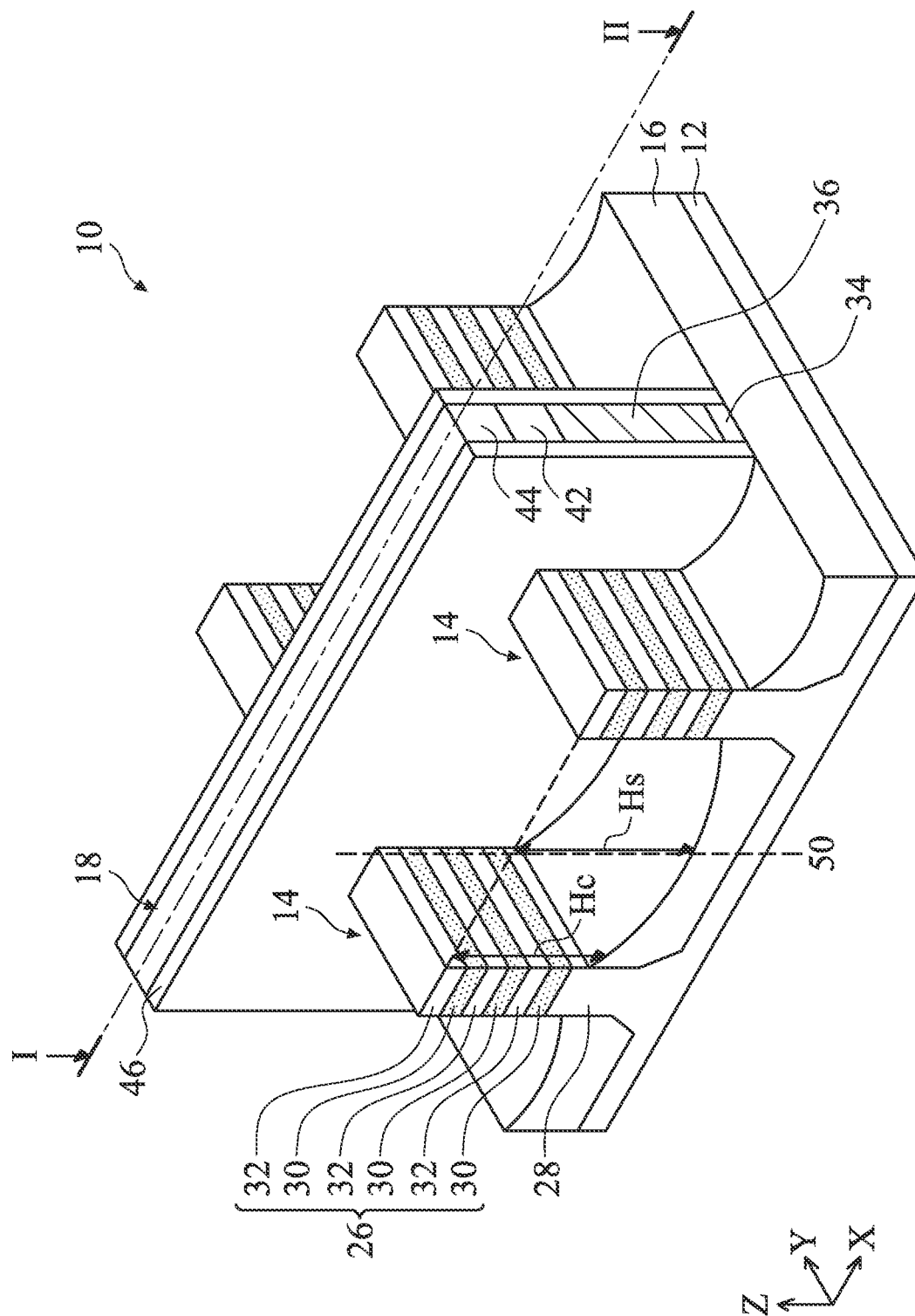
FIG. 1 illustrates a perspective view of an example semiconductor device in accordance with some embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and the fabrication thereof, and more particularly to multi-gate transistors. Multi-gate transistors include those transistors whose gate structures are formed on at least two-sides of a channel region. These multi-gate transistors may include a p-type metal-oxide-semiconductor transistor or an n-type metal-oxide-semiconductor multi-gate transistor. In the formation of multi-gate transistors, shallow trench isolation (STI) regions are formed to separate adjacent transistors. A profile of the top surface of the STI regions affects, among other factors, heights of the channel regions (also termed as "channel height") of the multi-gate transistors. An object of the present disclosure is to devise a profile of the top surface of the STI regions so as to adjust channel heights and in turn achieve better current drive and leakage suppression performance of the transistors.

Among multi-gate transistors, gate-all-around (GAA) transistor is a type of multi-gate transistor that has a gate structure extending around the channel region providing access to the stacked channel layers on four sides. The details of the structure and fabrication methods of the present disclosure are described below in conjunction with the accompanied drawings, which illustrate a process of making GAA transistors, according to some embodiments. A GAA transistor has vertically-stacked horizontally-oriented channel layers as channel regions of the transistor. The term "channel layer" is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. In some examples, the channel layer is referred to as a "nanowire", a "nanosheet", and the like that as used herein includes channel layers of various geometries (e.g., cylindrical, bar-shaped) and various dimensions. GAA transistors are promising candidates to take CMOS to the next stage of the roadmap due to their better gate control ability, lower leakage current, and fully FinFET device layout compatibility. For the purposes of simplicity, the present disclosure uses GAA devices as an example. Those of ordinary skill in the art should appreciate that they may readily use the present disclosure as a basis for designing or modifying other processes and structures (such as FinFET transistors, as another type of multi-gate transistors, on account of their fin-like structure) for carrying out the same purposes and/or achieving the same advantages of the embodiments introduced herein.

FIG. 1 is an exemplary perspective view of an intermediate structure at one stage of an exemplary method for fabricating a semiconductor device 10 that includes GAA transistors, in accordance with some embodiments. The semiconductor device 10 depicted in the FIG. 1 includes, among other features, a substrate 12, fin structures 14, isolation features 16, and a dummy gate structure 18. Some layers and/or features are omitted in FIG. 1 for simplification.

The substrate 12 may be a bulk semiconductor substrate, or a semiconductor-on-insulator (SOI) substrate, which may be doped (e.g., with a p-type or an n-type dopant) to form various well regions or doped regions therein, or undoped. Generally, an SOI substrate includes a layer of a semiconductor material formed on an insulator layer. The insulator layer may be a buried oxide (BOX) layer, a silicon oxide layer, or the like. The insulator layer is provided on a silicon or glass substrate. The substrate 12 may be made of silicon or another semiconductor material. For example, the substrate 12 is a silicon wafer. In some examples, the substrate 12 is made of a compound semiconductor such as silicon germanium (SiGe), silicon carbide (SiC), gallium arsenic (GaAs), indium arsenide (InAs), or indium phosphide (InP). In some examples, the substrate 12 is made of an alloy semiconductor such as GaAsP, AlInAs, AlGaAs, GaInAs, GaInP, or GaInAsP.

Multiple fin structures 14 protrude from the substrate 12. Each of the fin structures 14 includes an epitaxial portion 26 and a base portion 28. The epitaxial portion 26 includes epitaxial layers 30 of a first composition interposed by epitaxial layers 32 of a second composition. The first and second composition can be different. In some embodiments, the epitaxial layers 30 are SiGe and the epitaxial layers 32 are silicon. The epitaxial layers 32 may serve as channel layers for GAA transistors and may also be referred to as the channel layers 32. The epitaxial layers 30 will be subsequently removed and may also be referred to as the sacrificial layers 30. As described in more detail below, the epitaxial portion 26 and the base portion 28 are formed by patterning an epitaxial stack overlying the substrate 12 and a top portion of the substrate 12, in some embodiments. Due to its flat-topped elevation, the base portion 28 is also termed as mesa 28.

In addition, dummy gate structure(s) 18 is formed across the fin structures 14, along the sidewalls and over the top surfaces of the fin structures 14. The dummy gate structure 18 is also formed on the isolation features 16. The longitudinal direction of the dummy gate structure 18 is generally perpendicular to the longitudinal direction of the fin structures 14. In some embodiments, the dummy gate structure 18 serves as a placeholder for functional gate structure(s) and will be replaced in a gate-last process to form GAA transistors. The regions of the fin structures 14 underlying the dummy gate structure 18 are referred to as channel regions. Each of the channel regions in the fin structures 14 is sandwiched between two source/drain regions.

The dummy gate structure 18 includes a dummy gate dielectric layer 34 and a dummy gate electrode layer 36 over the dummy gate dielectric layer 34. In some embodiments, the dummy gate electrode layer 36 is made of poly-silicon. The dummy gate dielectric layer 34 may be made of silicon oxide, silicon nitride, silicon oxynitride or another low dielectric constant (low-k) dielectric material. The dummy gate dielectric layer 34 and the dummy gate electrode layer 36 are formed independently using a deposition process, such as CVD, PVD ALD, high density plasma CVD (HDPCVD), metal organic CVD (MOCVD), or plasma enhanced CVD (PECVD) process. Then, those deposited layers of the dummy gate dielectric layer 34 and the dummy gate electrode layer 36 are patterned into the dummy gate structure 18 using photolithography and etching processes. The etching process is anisotropic and may include a reactive ion etch (RIE), neutral beam etch (NBE), or another suitable etching process. The etching process may use a first hard mask 42 and a second hard mask 44 as etch masks. Sidewalls of the dummy gate structure 18 are covered by gate spacers 46. The gate spacers 46 are formed over the fin structures 14 and the isolation features 16. The gate spacers 46 may be formed by conformally depositing one or more spacer layers and anisotropically etching the one or more spacer layers. The one or more spacer layers may include silicon oxide ($SiO_2$), silicon nitride (SiN or $Si_3N_4$), silicon oxynitride (SiON), silicon carbon nitride (SiCN), or a combination thereof, and may be deposited by CVD, ALD or another deposition process. The etching process may include a RIE, NBE, or another etching process.

Still referring to FIG. 1, the isolation features 16 are disposed between neighboring pairs of the fin structures 14. The isolation features 16 are formed from an insulating material such as silicon oxide, silicon nitride, silicon oxynitride, fluoride-doped silicate glass (FSG), or another low dielectric constant (low-k) dielectric material. The isolation features 16 may be formed by filling trenches between the fin structures 14 with the insulating material using a deposition process, such as chemical vapor deposition (CVD) process, flowable CVD (FCVD) process, spin-on-glass (SOG) process, or another applicable process, and then the filled insulating material is recessed in an etch back process. The recessed isolation features 16 are also referred to as shallow trench isolation (STI) features 16 (or termed as "STI regions"). In the formation of the STI features 16, the etch back process and other cleaning operations are used to recess the top surface of the STI feature to expose the epitaxial portion 26 and a top portion of the mesa 28 of the fin structures 14. In the illustrated embodiment, a top surface of the STI features 16 is below a top surface of the mesa 28, such that a top portion of the sidewalls of the mesa 28 is above the STI features 16.

As a result of the etch back process and/or other cleaning operations, it is observed that a center portion of the top surface of the STI features 16, which is close to a middle line 50 of the space between neighboring fin structures 14, appears lower than corner portions of the top surface of the STI features 16, which is close to sidewalls of the fin structures 14. In this respect, the top surface of the STI features 16 has a curvature profile, such as a concave (or dishing) profile. A vertical distance (denoted as Hc) from a top surface of the top channel layer 32 to the corner portions of the top surface of the STI features 16 (e.g., at a position the STI region 16 having a lateral thickness (defined as 1.5 nm as an example) with respect to a sidewall of the mesa 28) is referred to as the "channel height" of a transistor, as this represents the height of a channel region that is above the STI features and thereby under direct control of a functional gate structure. A vertical distance (denoted as Hs) from a top surface of the top channel layer 32 to the center portion of the top surface of the STI features 16 along the middle line 50 is termed as a "step height" of a transistor. The curvature profile can be benchmarked by the difference between the step height and the channel height (i.e., Hs-Hc). Larger the height difference translates to a stronger curvature profile, and vice versa.

Since the curvature profile of the STI features 16 affects, among other factors, the channel height Hc of the transistors, it impacts the device performance in multiple ways. Generally, higher the channel height means there is more channel region that a functional gate structure can effectively engage, which in turn leads to a stronger current drive capability. Meanwhile, higher the channel height also means there is a larger top portion of the mesa 108 that a functional gate structure may directly engage, which in turn leads to stronger leakage current flowing into the substrate 12. Further, the curvature profile may also constrain the shape of epitaxial growth during the formation of source/drain features of the transistors. An object of the present disclosure is to devise the top surface profile of the STI features in different regions, e.g., in n-type regions and p-type regions, so as to fine tune device performance to suite different application needs.

FIGS. 2A-2D illustrate flow charts of some embodiments of a method 100 for forming multi-gate devices according to various aspects of the present disclosure. FIGS. 2A-2D will be described below in conjunction with FIGS. 3-29. FIGS. 3-29 are fragmentary cross-sectional views of a semiconductor device 200 at various stages of fabrication according to method 100. The method 100 is merely an example, and is not intended to limit the present disclosure beyond what is explicitly recited in the claims. Additional steps can be provided before, during, and after method 100, and some of the steps described can be moved, replaced, or eliminated for additional embodiments of method 100. Additional features can be added in the semiconductor device depicted in FIGS. 3-29 and some of the features described below can be replaced, modified, or eliminated in other embodiments of the semiconductor device.

As with the other method embodiments and exemplary devices discussed herein, it is understood that parts of the semiconductor device 200 may be fabricated by a CMOS technology process flow, and thus some processes are only briefly described herein. Further, the exemplary semiconductor devices may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the inventive concepts of the present disclosure. In some embodiments, the exemplary devices include a plurality of semiconductor devices (e.g., transistors), including PFETs, NFETs, etc., which may be interconnected. On various aspects, the semiconductor device 200 is similar to the semiconductor device 10 illustrated in FIG. 1. FIGS. 3-29 represents fragmentary cross-sectional views of the semiconductor device 200 as along a cut of the I-II line in FIG. 1, which cuts through channel regions of the to-be-formed n-type and p-type transistors. Moreover, it is noted that the process steps of method 100, including any descriptions given with reference to FIGS. 3-29, as with the remainder of the method and exemplary figures provided in this disclosure, are merely exemplary and are not intended to be limiting beyond what is specifically recited in the claims that follow.

Figure 3:
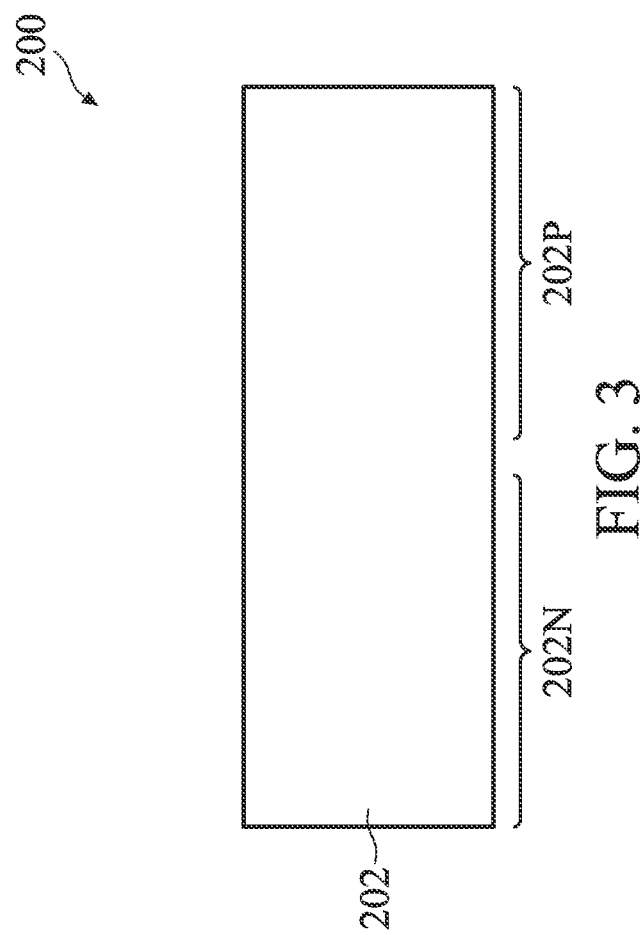
FIGS. 3, 4, 5, 6, 7, 8, 9, 10, 11, 12, 13, 14, 15, 16, 17, 18, 19, 20, 21, 22, 23, 24, 25, 26, 27, 28, and 29 are fragmentary cross-sectional views of an example semiconductor device in accordance with some embodiments of the present disclosure.

At operation 102, the method 100 (FIG. 2A) provides a substrate 202, as shown in FIG. 3. The substrate 202 may be a part of a wafer, and may be a bulk semiconductor substrate or a Semiconductor-on-Insulator (SOI) substrate. Generally, an SOI substrate is a layer of a semiconductor material formed on an insulator layer. The insulator layer may be, for example, a Buried Oxide (BOX) layer, which may be a silicon oxide layer, or the like. The insulator layer is provided on a substrate, typically a silicon or glass substrate. Other substrates, such as a multi-layered or gradient substrate may also be used. In accordance with some embodiments, the semiconductor material of the substrate 202 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 202 has a region 202N and a region 202P. The region 202N can be used for forming n-type devices, such as NMOS transistors, e.g., n-type GAA transistors. The region 202P can be used for forming p-type devices, such as PMOS transistors, e.g., p-type GAA transistors. Throughout the description, the regions 202N and 202P are referred to as an NMOS region and a PMOS region, respectively. The NMOS region 202N may be joined with the PMOS region 202P. Alternatively, the NMOS region 202N may be separated from the PMOS region 202P, and any number of device features (e.g., other active devices, doped regions, isolation structures, etc.) may be disposed between the NMOS region 202N and the PMOS region 202P.

Figure 4:
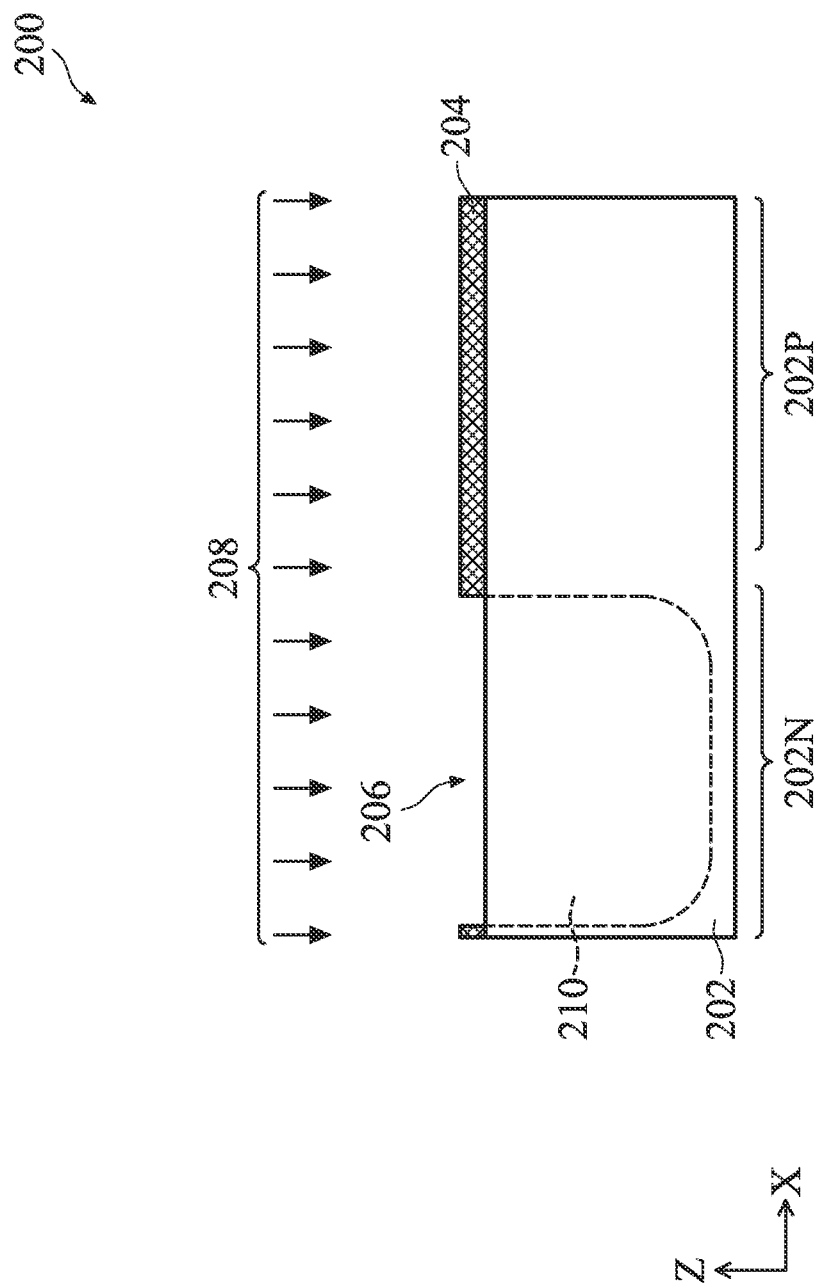

At operation 104, the method 100 (FIG. 2A) forms implantation regions in the NMOS region 202N in the substrate 202. Referring to FIG. 4, an implantation mask 204 is formed. In some embodiments, the implantation mask 204 is formed of photo resist, which is coated and then patterned to form an opening 206 overlying the NMOS region 202N. A p-type dopant implantation (marked as 208) is then performed to form a p-well 210. The p-type dopant may include boron, indium, or combinations thereof. The implantation may be performed using an energy in the range between about 50 keV and about 150 keV. The p-type dopant concentration may be equal to or less than $10^{18}$ cm$^{-3}$, such as in the range between about $10^{17}$/cm$^3$ and about $10^{18}$/cm$^3$. The p-type dopant has a certain distribution (such as Gaussian distribution), and there may not be sharp edges/top surfaces/bottom surfaces. In accordance with some embodiments, if the concentration of a dopant falls below about 50 percent of its peak concentration, it is considered that the respective position is the edges/top surfaces/bottom surfaces.

Figure 5:
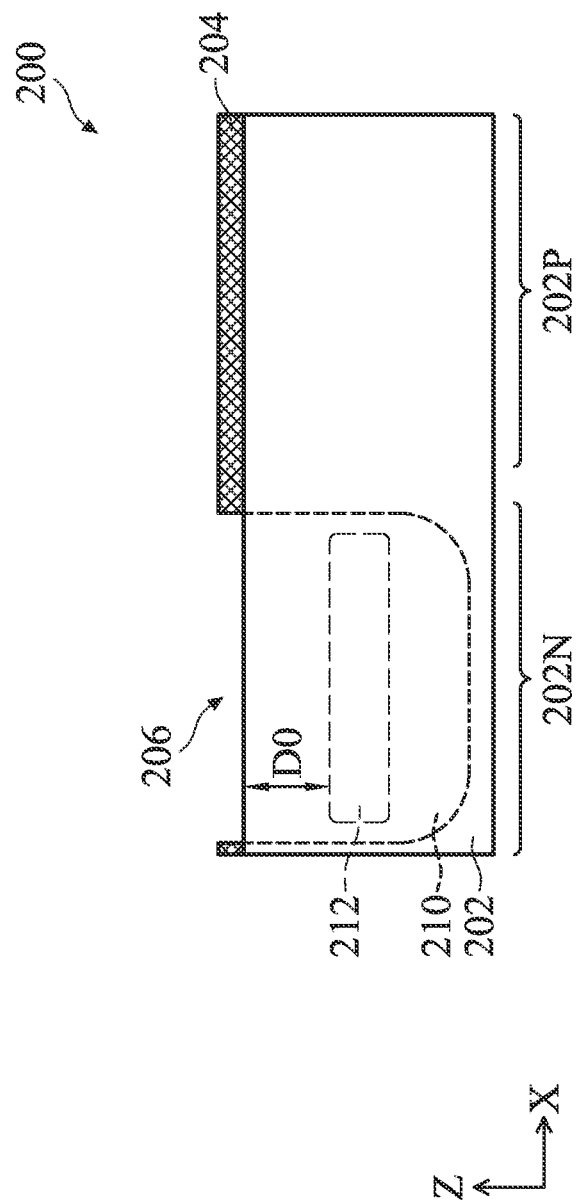

Referring to FIG. 5, the method 100 at operation 104 may optionally form a high-doping region 212. The high-doping region 212 may be co-implanted with the p-well 210 with the same p-type dopant. Alternatively, the high-doping region 212 may be implanted with a p-type dopant different from the p-well 210. The high-doping region 212 has a higher dopant concentration than the p-well 210. The p-type dopant concentration in the high-doping region 212 may be larger than $10^{18}$/cm$^3$, such as in the range between about $10^{18}$/cm$^3$ and about $10^{19}$/cm$^3$. The implantation may be performed using an energy in the range between about 80 keV and about 120 keV. The bottom surface of the high-doping region 212 is above the bottom surface of the p-well 210. The top surface of the high-doping region 212 is spaced apart from the top surface of the substrate for a distance D0, such that during the patterning of the substrate 202 to form a mesa of a fin structure in later processes the top portion of the substrate 202 with a thickness equal to or larger than D0 will be removed, thereby exposing the high-doping region 212. As described in more detail below, this allows dopants in the high-doping region 212 (as well as dopants in the p-well 210) to diffuse into to-be-formed isolation features to adjust etch rate in an etch back process as an effort to adjust curvature profile in the NMOS region 202N.

Figure 6:
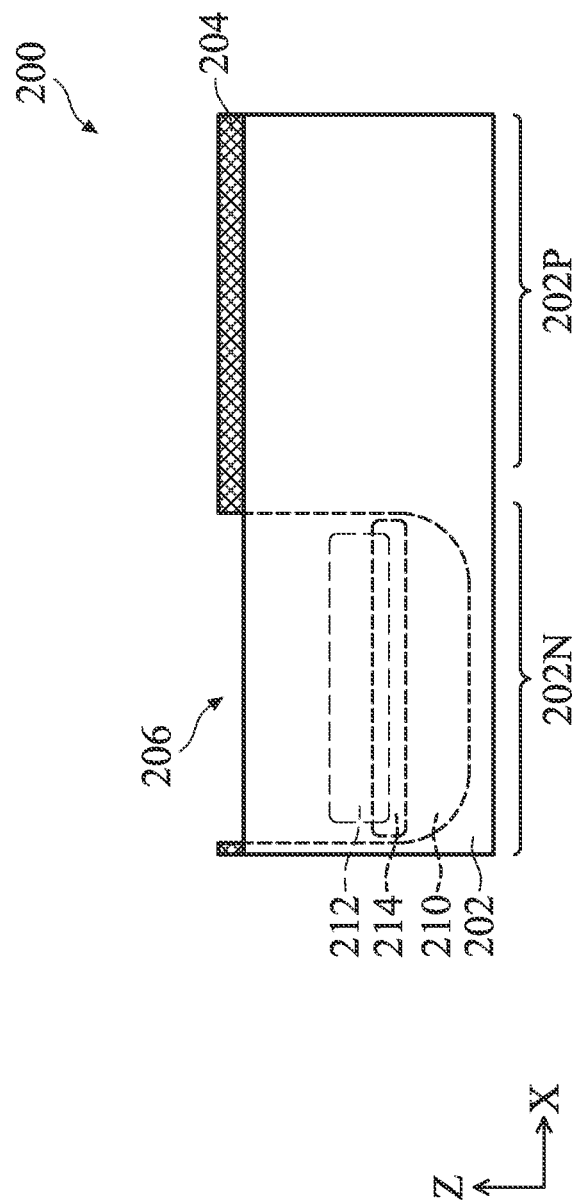

Referring to FIG. 6, an Anti-Punch-Through (APT) implantation is also performed to form anti-punch-through region 214. The conductivity type of the dopants implanted during the APT implantation is also p-type. The anti-punch-through region 214 may be implanted the same p-type dopant as in the p-well 210. The anti-punch-through region 214 has a top surface spaced apart from the top surface of the substrate 202, and may overlap with a bottom portion of the high-doping region 212. The anti-punch-through region 214 has a bottom surface below or over the bottom surface of the high-doping region 212. In the illustrated embodiment, the bottom surface of the anti-punch-through region 214 is below the bottom surface of the high-doping region 212. The position of anti-punch-through region 214 is selected so that it is below the bottom surfaces of the subsequently formed source/drain features in the resulting n-type FinFET, which is formed in subsequent steps. The anti-punch-through region 214 is used to reduce the leakage from the source/drain regions to the substrate 202. The doping concentration in anti-punch-through region 214 may be in the range between about $1\times10^{19}$/cm$^3$ and about $1\times10^{20}$/cm$^3$ in accordance with some embodiments.

As shown in FIGS. 4, 5, and 6, the p-well 210, the high-doping region 212, and the anti-punch-through region 214 may be formed using the same implantation mask 204. In accordance with alternative embodiments of the present disclosure, different implantation masks may be used. For example, the high-doping region 212 may be implanted using a different implantation mask than the mask used for forming the p-well 210 and the anti-punch-through region 214, so that the position and the size of the high-doping region 212 may be customized independently from the position and the size of the p-well 210 and the anti-punch-through region 214. For example, in one embodiment, the high-doping region 212 may include two portions disposed on both sides of the mesa of a to-be-formed fin structure, but not directly under the mesa. The implantation mask 204 is then removed, such as by an acceptable ashing process.

Figure 7:
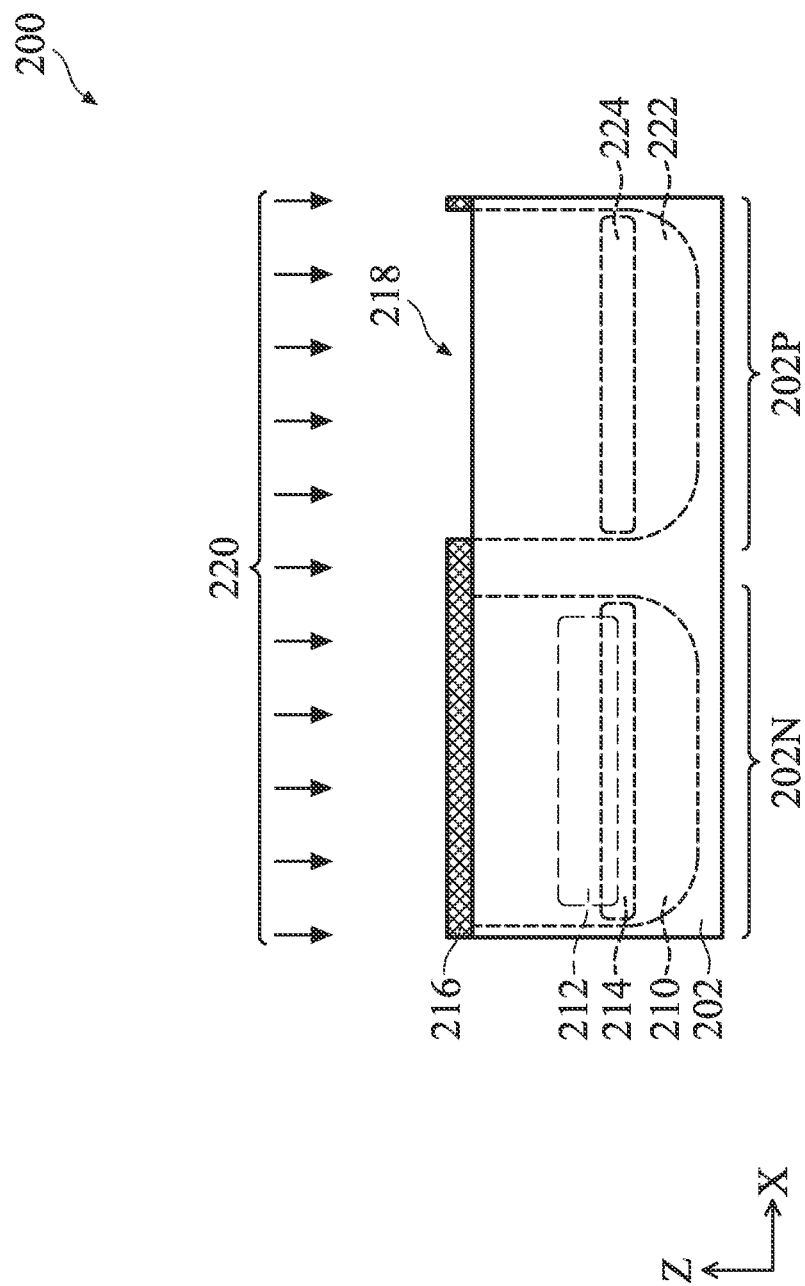

At operation 106, the method 100 (FIG. 2A) forms one or more implantation regions in the PMOS region 202P in the substrate 202. Referring to FIG. 7, an implantation mask 216 is formed. In some embodiments, the implantation mask 216 is formed of photo resist, which is coated and then patterned to form an opening 218 overlying the PMOS region 202P. An n-type dopant implantation (marked as 220) is then performed to form an n-well 222. The n-type dopant may include phosphorous, arsenic, antimony, or combinations thereof. The implantation may be performed using an energy in the range between about 50 keV and about 150 keV. The n-type dopant concentration may be equal to or less than $10^{18}$/cm$^3$, such as in the range between about $10^{17}$/cm$^3$ and about $10^{18}$/cm$^3$. An APT implantation is also performed to form anti-punch-through region 224. The conductivity type of the dopants implanted during the APT implantation is also n-type. The anti-punch-through region 224 may be implanted the same n-type dopant as in the n-well 222. The anti-punch-through region 224 has a top surface spaced apart from the top surface of the substrate 202. The anti-punch-through region 224 has a bottom surface above the bottom surface of the n-well 222. The position of anti-punch-through region 224 is selected so that it is below the bottom surfaces of the subsequently formed source/drain features in the resulting p-type FinFET, which is formed in subsequent steps. The anti-punch-through region 224 is used to reduce the leakage from the source/drain regions to the substrate 202. The doping concentration in anti-punch-through region 224 may be in the range between about $1\times10^{19}$/cm$^3$ and about $1\times10^{20}$/cm$^3$ in accordance with some embodiments. The implantation mask 216 is then removed, such as by an acceptable ashing process. Subsequently, in some implementations, an annealing process is performed to activate dopants in the various implantation regions formed in the substrate 202.

In accordance with some embodiments, no diffusion region (similar to the high-doping region 212) is formed in the PMOS region 202P. Accordingly, the etch rate in an etch back process of the to-be-formed isolation features in the PMOS region 202P won't be adjusted to the same extent as in the NMOS region 202N, which intentionally introduces curvature profile difference in the two regions 202N and 202P. In some embodiments, the high-doping region 212 is not formed in the NMOS region 202N either, but the dopant concentration in the p-well 210 is higher than the n-well 222, such as 20% to 50% higher. Accordingly, stronger diffusion from the p-well 210 than the n-well 222 into the to-be-formed isolation features is sufficient to introduce curvature profile difference in the two regions 202N and 202P.

Figure 8:
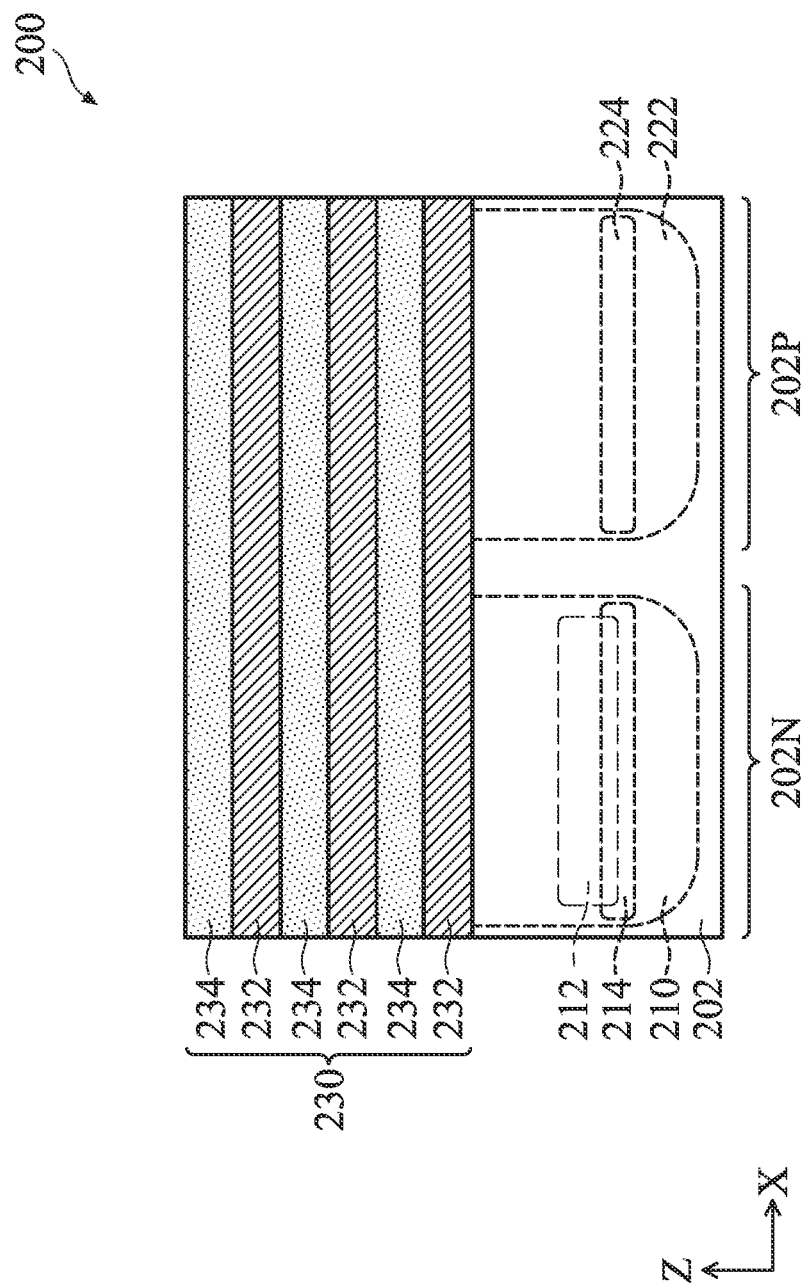

At operation 108, the method 100 (FIG. 2A) forms one or more epitaxial layers over the substrate 202, as shown in FIG. 8. In some embodiments, an epitaxial stack 230 is formed over the substrate 202. The epitaxial stack 230 includes epitaxial layers 232 of a first composition interposed by epitaxial layers 234 of a second composition. The first and second composition can be different. In an embodiment, the epitaxial layers 232 are SiGe and the epitaxial layers 234 are silicon. However, other embodiments are possible including those that provide for a first composition and a second composition having different oxidation rates and/or etch selectivity. In some embodiments, the epitaxial layer 232 includes SiGe and where the epitaxial layer 234 includes silicon, the silicon oxidation rate is less than the SiGe oxidation rate. It is noted that three (3) layers of each of epitaxial layers 232 and 234 are illustrated in FIG. 8, which is for illustrative purposes only and not intended to be limiting beyond what is specifically recited in the claims. It can be appreciated that any number of epitaxial layers can be formed in the epitaxial stack 230; the number of layers depending on the desired number of channel layers for the device 200. In some embodiments, the number of epitaxial layers 234 is between 2 and 10, such as 4 or 5.

In some embodiments, the epitaxial layer 234 has a thickness ranging from about 4 nm to about 12 nm. The epitaxial layers 234 may be substantially uniform in thickness. In some embodiments, the epitaxial layer 232 has a thickness ranging from about 3 nm to about 8 nm. In some embodiments, the epitaxial layers 232 of the stack are substantially uniform in thickness. As described in more detail below, the epitaxial layers 234 serve as channel layers for a subsequently-formed multi-gate device and the thickness of one epitaxial layer 234 is chosen based on device performance considerations. The epitaxial layers 234 are also referred to as channel layers 234. The epitaxial layers 232 serve to define a gap distance between adjacent channel layers for a subsequently-formed multi-gate device and the thickness of one epitaxial layer 232 is chosen based on device performance considerations. The epitaxial layers 232 are also referred to as sacrificial layers 232.

By way of example, epitaxial growth of the epitaxial stack 230 may be performed by a molecular beam epitaxy (MBE) process, a metalorganic chemical vapor deposition (MOCVD) process, and/or other suitable epitaxial growth processes. In some embodiments, the epitaxially grown layers, such as the epitaxial layers 234, include the same material as the substrate 202. In some embodiments, the epitaxially layers 232 and 234 include a different material than the substrate 202. As stated above, in at least some examples, the epitaxial layer 232 includes an epitaxially grown $Si_{1-x}Ge_x$ layer (e.g., x is about 25-55%) and the epitaxial layer 234 includes an epitaxially grown silicon (Si) layer. Alternatively, in some embodiments, either of the epitaxial layers 232 and 234 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 232 and 234 may be chosen based on providing differing oxidation, etch selectivity properties. In various embodiments, the epitaxial layers 232 and 234 are substantially dopant-free, where for example, no intentional doping is performed during the epitaxial growth process.

Figure 9:
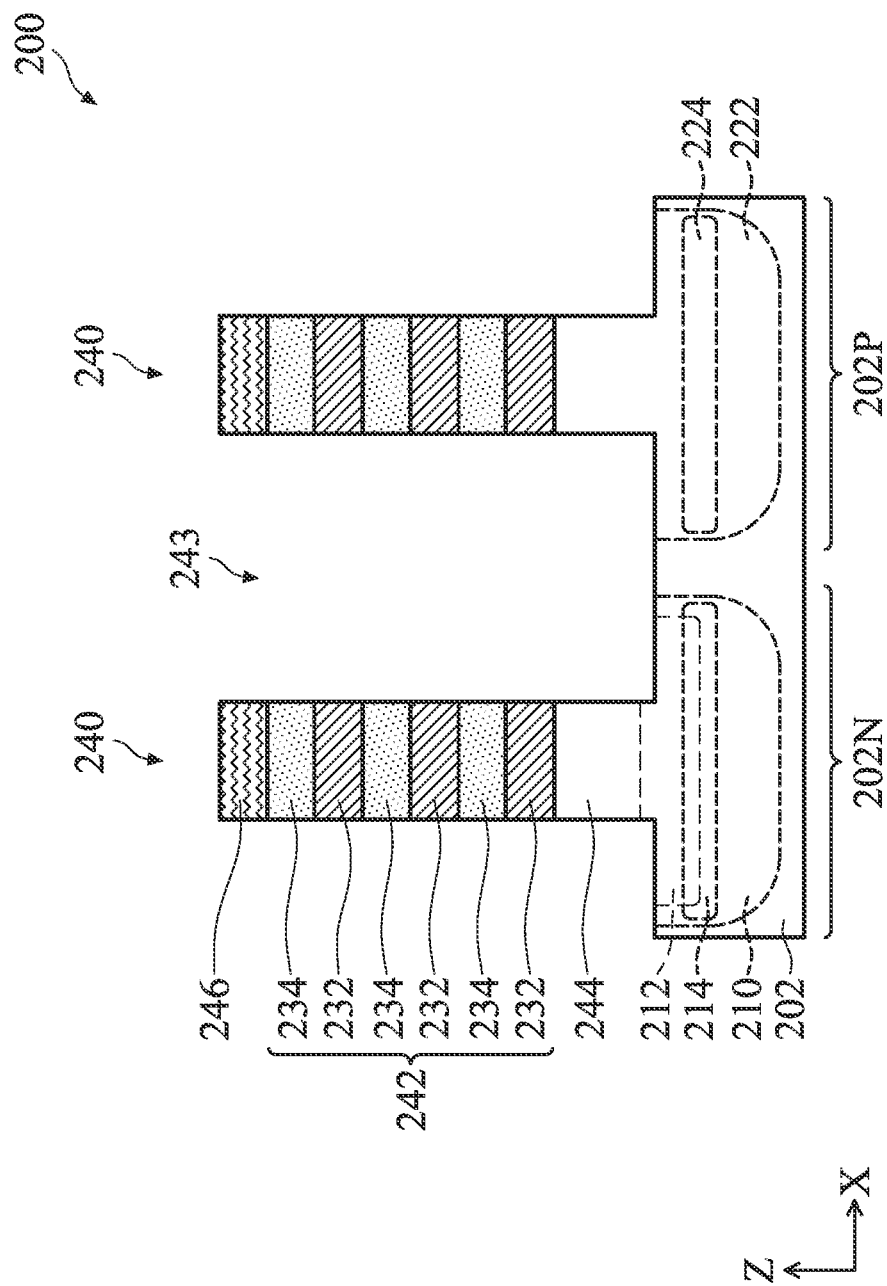

At operation 110, the method 100 (FIG. 2A) patterns the epitaxial stack 230 and a top portion of the substrate 202 to form fin structures 240, as shown in FIG. 9. Each of the fin structures 240 includes an epitaxial portion 242 from the patterning of the epitaxial stack 230 and a mesa 244 from the patterning of the top portion of the substrate 202. Adjacent fin structures 240 are separated by fin trenches 243. To pattern the epitaxial stack 230, a hard mask layer 246 is deposited over the epitaxial stack 230. The hard mask layer 246 is then patterned to serve as an etch mask to pattern the interleaved sacrificial layers 232 and channel layers 234, and a top portion of the substrate 202. In some embodiments, the hard mask layer 246 may be deposited using CVD, plasma-enhanced CVD (PECVD, atomic layer deposition (ALD), plasma-enhanced ALD (PEALD), or a suitable deposition method. The hard mask layer 246 may be a single layer or a multi-layer. When the hard mask layer 246 is a multi-layer, the hard mask layer 246 may include a pad oxide and a pad nitride layer. The fin structures 240 may be patterned using suitable processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the hard mask layer 246 and then the patterned hard mask layer 246 may be used as an etch mask to etch the epitaxial stack 230 and the top portion of the substrate 202 to form the fin structures 240. The etching process can include dry etching, wet etching, reactive ion etching (RIE), and/or other suitable processes. The removal of the top portion of the substrate 202 exposes the high-doping region 212 in the NMOS region 202N. In the illustrated embodiment, a top portion of the high-doping region 212 is part of a bottom portion of the mesa 244. As discussed above, depending on the implantation mask used in forming the high-doping region 212, the high-doping region 212 may include two spaced apart portions disposed on both sides of the mesa 244 but not as part of the mesa 244 or directly under the mesa 244, which may reduce dopant diffusion from the high-doping region 212 into the fin structure 240 in subsequent anneal process.

Figure 10:
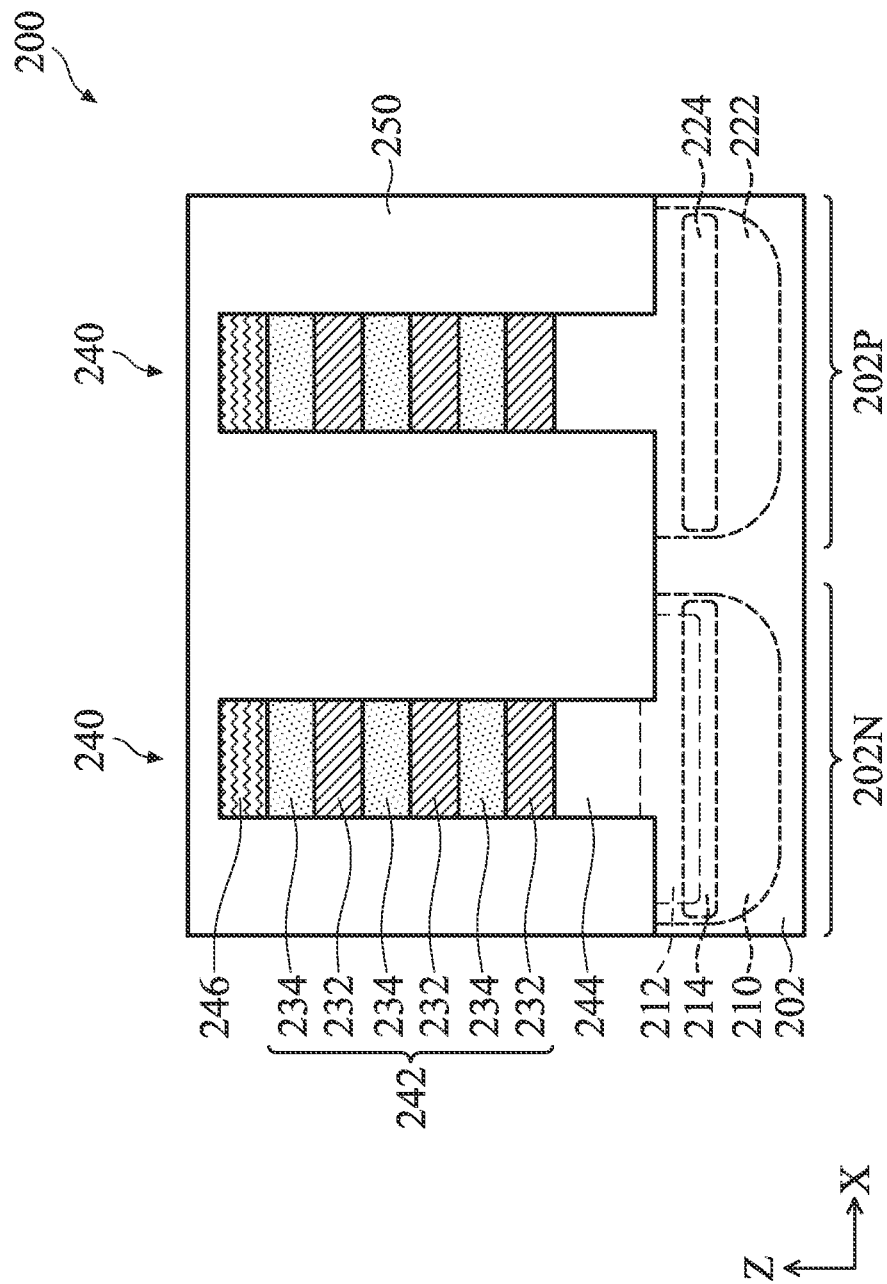
Figure 11:
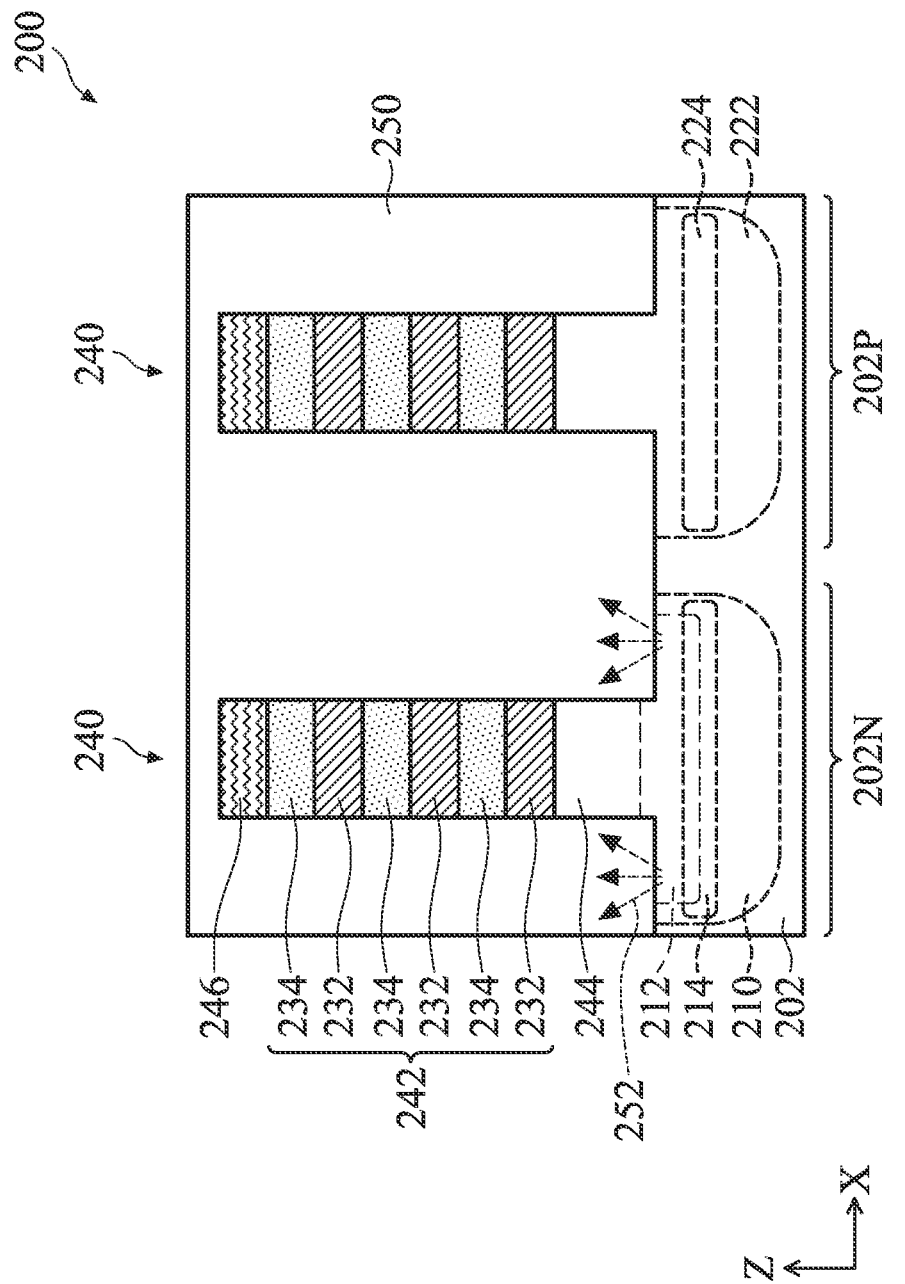

At operation 112, the method 100 (FIG. 2A) fills the fin trenches 243 between adjacent fin structures 240 with a dielectric material to form isolation features 250, as shown in FIG. 10. The isolation features 250 may include one or more dielectric layers. Suitable dielectric materials for the isolation features 250 may include silicon oxides, silicon nitrides, silicon carbides, FluoroSilicate Glass (FSG), low-K dielectric materials, and/or other suitable dielectric materials. The dielectric material may be deposited by any suitable technique including thermal growth, CVD, HDP-CVD, PVD, ALD, and/or spin-on techniques. In accordance with some embodiments, the isolation features 250 is formed such that excessive dielectric material covers the fin structures 240. Although the isolation features 250 are illustrated as a single layer, some embodiments may utilize multiple layers. In the illustrated embodiment, the dielectric material is silicon oxide formed by a FCVD process.

Figure 12:
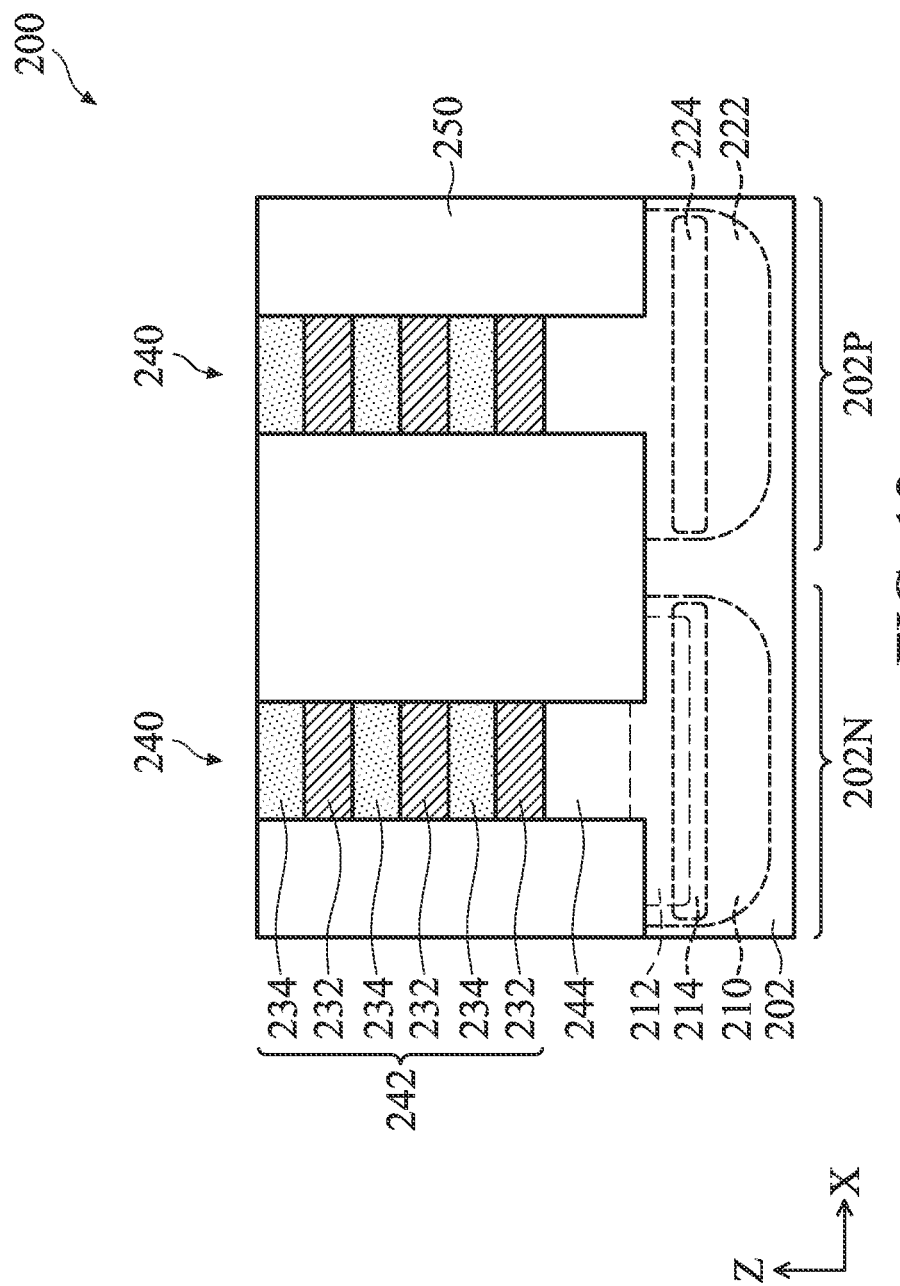

At operation 114, the method 100 (FIG. 2A) performs an anneal process. The anneal process may be performed once the dielectric material is deposited. The anneal process involves elevated temperature. In some embodiments, the anneal process includes an anneal temperature between about 400° C. and about 850° C. for a duration of about half an hour to about 14 hours. The anneal process causes the diffusion of the dopant in the high-doping region 212 into the bottom portion of the isolation features 250, represented by arrows 252 in FIG. 11. For example, the p-type dopant in the high-doping region 212, such as boron atoms, is prone to the diffusion under thermal budget. A dopant concentration may have a gradient profile that it has a peak in the high-doping region 212 and gradually decreases further upwardly into the isolation features 250. The dopant concentration may remain in the bottom portion of the isolation features 250, such as below the bottom channel layer 234. The out-diffusion of the dopants increases the etch rate of the bottom portion of the isolation features 250 in a subsequent etch back process. The anneal process may also cause the diffusion of the dopants in the p-well 210 and the n-well 222 into the bottom portion of the isolation features 250. That is, n-type dopants may also diffuse into the bottom portion of the isolation features 250 in the PMOS region 202P and cause etch rate reduction in the PMOS region 202P as well. Yet due to the high dopant concentration in the high-doping region 212, the etch rate reduction in the NMOS region 202N is more than the PMOS region 202P as a result of a higher dopant concentration in the isolation features 250 in the NMOS region 202N. In embodiments that the formation of the high-doping region 212 is skipped, a dopant concentration in the p-well 210 is higher than the n-well 222, such as 20% to 50% higher, which still allows a stronger dopant diffusion in the NMOS region 202N than in the PMOS region 202P. After the deposition of the dielectric material, the semiconductor device 200 is planarized using a chemical mechanical polishing (CMP) process. The hard mask 246 may also be removed to expose the top channel layer 234 during the CMP process, such as shown in FIG. 12.

Figure 13:
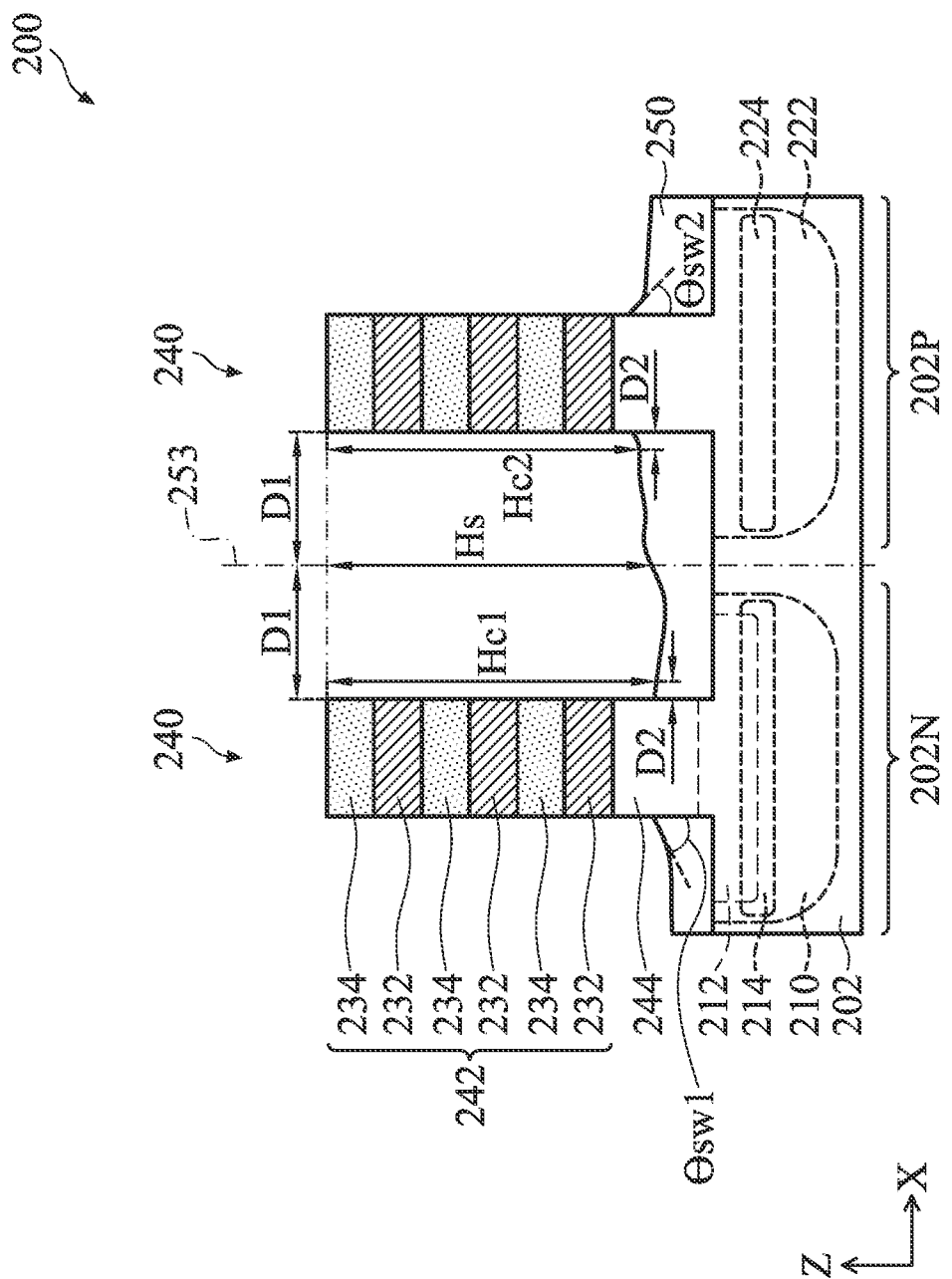
Figure 14:
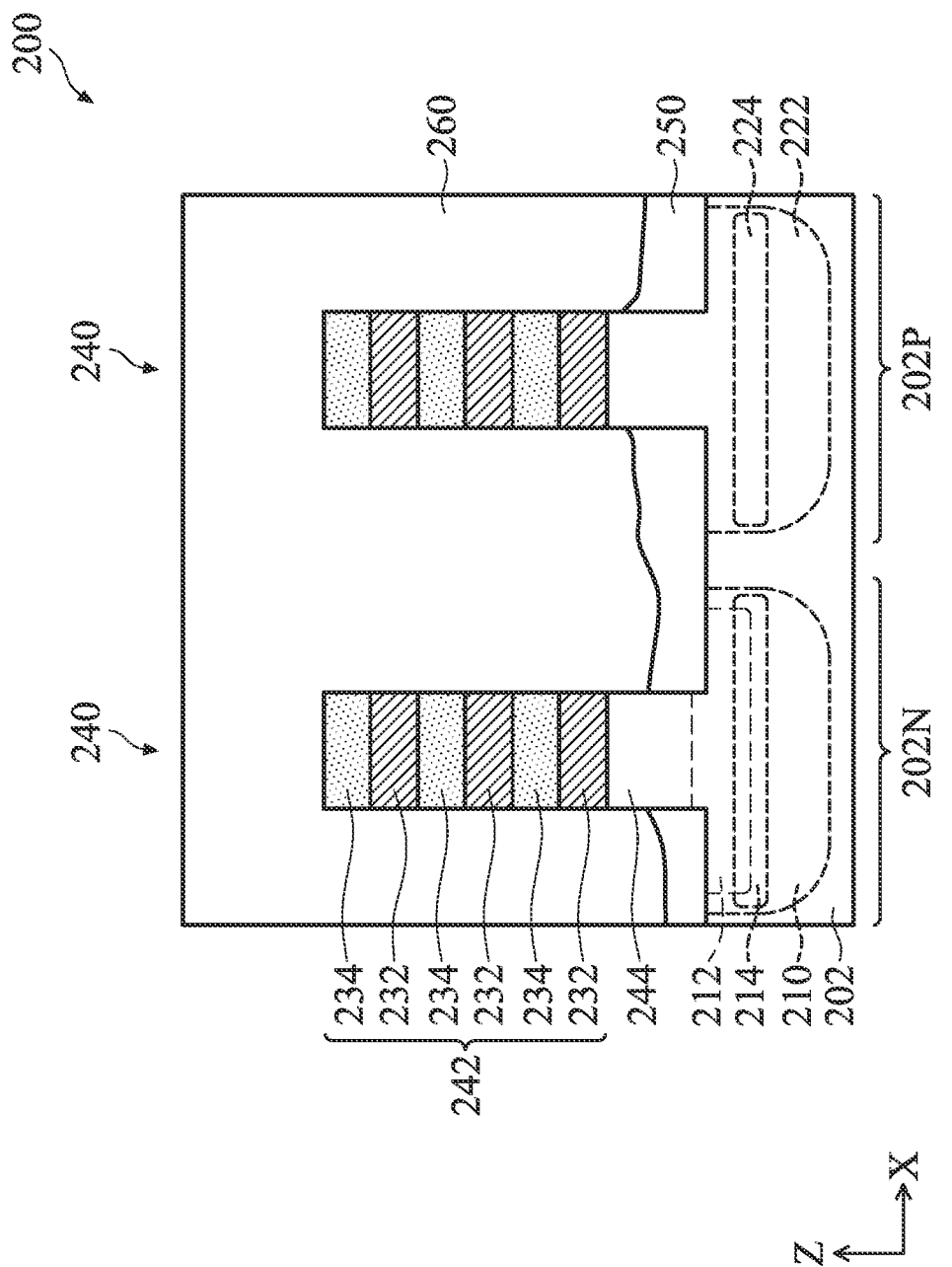

At operation 116, the method 100 (FIG. 2A) recesses the isolation features 250 in an etch back process to form shallow trench isolation (STI) features (also denoted as STI features 250 or STI regions 250), as shown in FIG. 13. Any suitable etching technique may be used to recess the isolation features 250 including dry etching, wet etching, RIE, and/or other etching methods, and in an exemplary embodiment, an anisotropic dry etching is used to selectively remove the dielectric material of the isolation features 250 without etching the fin structures 240. In an embodiment, the etch back process is performed using a Siconi (also referred to as SiCoNi) process, in which the process gases include $NH_3$, HF, and the like. In an embodiment, the flow rate of $NH_3$ is about 10 sccm and about 1000 sccm, and the flow rate of HF is about 100 sccm and about 500 sccm.

The etch back process may be controlled by a time mode. During etching the top portion of the isolation features 250, the etch rates in the NMOS region 202N and the PMOS region 202P are roughly the same such that the top surfaces of the isolation features 250 in the two regions decreases at similar rate. This is because top portions of the isolation features 250 in the two regions have roughly the same dopant concentration. During etching the bottom portion of the isolation features 250 (e.g., below the bottom channel layer 234), the etch rate in the NMOS region 202N accelerates due to the higher dopant concentration, such that a top surface of the STI regions 250 in the NMOS region 202N is generally lower than in the PMOS region 202P when the etch back process stops.

As shown in FIG. 13, with respect to a middle line 253 in the space between neighboring fin structures 240, the top surface of the STI region 250 on one side of the middle line 253 in the NMOS region 202N is lower than the top surface of the STI region 250 on the other side of the middle line 253 in the PMOS region 202P. In some embodiments, a distance D1 between sidewalls of the fin structures 240 to the middle line 253 ranges from about 30 nm to about 40 nm. A step height Hs, measured from a top surface of the top channel layer 234 to the center portion of the top surface of the STI region 250 along the middle line 253, may range from about 55 nm to about 65 nm. In the NMOS region 202N, a channel height Hc1, measured from a top surface of the top channel layer 234 to the corner portions of the top surface of the STI region 250 (e.g., at a position the STI region 250 having a lateral thickness D2 (defined as 1.5 nm as an example) with respect to a sidewall of the mesa 244), may range from about 65 nm to about 75 nm. As a comparison, a channel height Hc2 in the PMOS region 202P may range from about 50 nm to about 60 nm. A channel height different ΔHc may range from about 5 nm to about 25 nm in some embodiments. For SRAM applications, there is generally a need for the n-type transistors to have stronger current drive capability and the p-type transistor to have less leakage current. Correspondingly, the larger channel height Hc1 allows the n-type transistors to have stronger current drive capability, while the smaller channel height Hc2 allows the p-type transistors to have less leakage current.

Still referring to FIG. 13, in the illustrated embodiment, the top surface profile of the STI regions 250 remains concave in both the NMOS region 202N and the PMOS region 202P but with different concave depth (as less in the NMOS region 202N). In the PMOS region 202P, the concave surface profile has a sidewall angle θsw2 (with respect to a sidewall of the fin structure 240) that is less than about 45 degrees at the corner edges of the STI region 250. As a comparison, in the NMOS region 202N, the concave surface profile has a sidewall angle θsw1 that is larger than about 55 degrees at the corner edges of the STI region 250 due to the extra recessed top surface profile. A sidewall angle larger than about 55 degrees less constrains the shape of epitaxial growth during the formation of source/drain features of the transistors. In some alternative embodiments, the top surfaces of the STI regions 250 in the NMOS region 202N may be formed flat or convex due to the excessive etch.

At operation 118, the method 100 (FIG. 2A) forms a dummy gate structure 260 over the channel regions of the fin structures 240. In some embodiments, a gate replacement process (or gate-last process) is adopted where the dummy gate structure 260 serves as a placeholder for functional gate structures. Other processes and configuration are possible. In the illustrated embodiment, the dummy gate structure 260 includes a dummy dielectric layer and a dummy electrode disposed over the dummy dielectric layer. In an example process, the dummy dielectric layer in the dummy gate structure 260 is blanket deposited over the semiconductor device 200 by CVD. A material layer for the dummy electrode is then blanket deposited over the dummy dielectric layer. The dummy dielectric layer and the material layer for the dummy electrode are then patterned using photolithography processes to form the dummy gate structure 260. In some embodiments, the dummy dielectric layer may include silicon oxide and the dummy electrode may include polycrystalline silicon (polysilicon). Subsequently, the method 100 may proceed to form gate spacers on sidewalls of the dummy gate structure 260, epitaxially grow source/drain features in the source/drain regions, and deposit contact etch stop layer (CESL) and interlayer dielectric (ILD) layer over the source/drain features. In some embodiments, after depositing the ILD layer, a CMP process is performed to planarize a top surface of the semiconductor device 200, such that the top surface of the dummy gate structure 260 is exposed.

Figure 15:
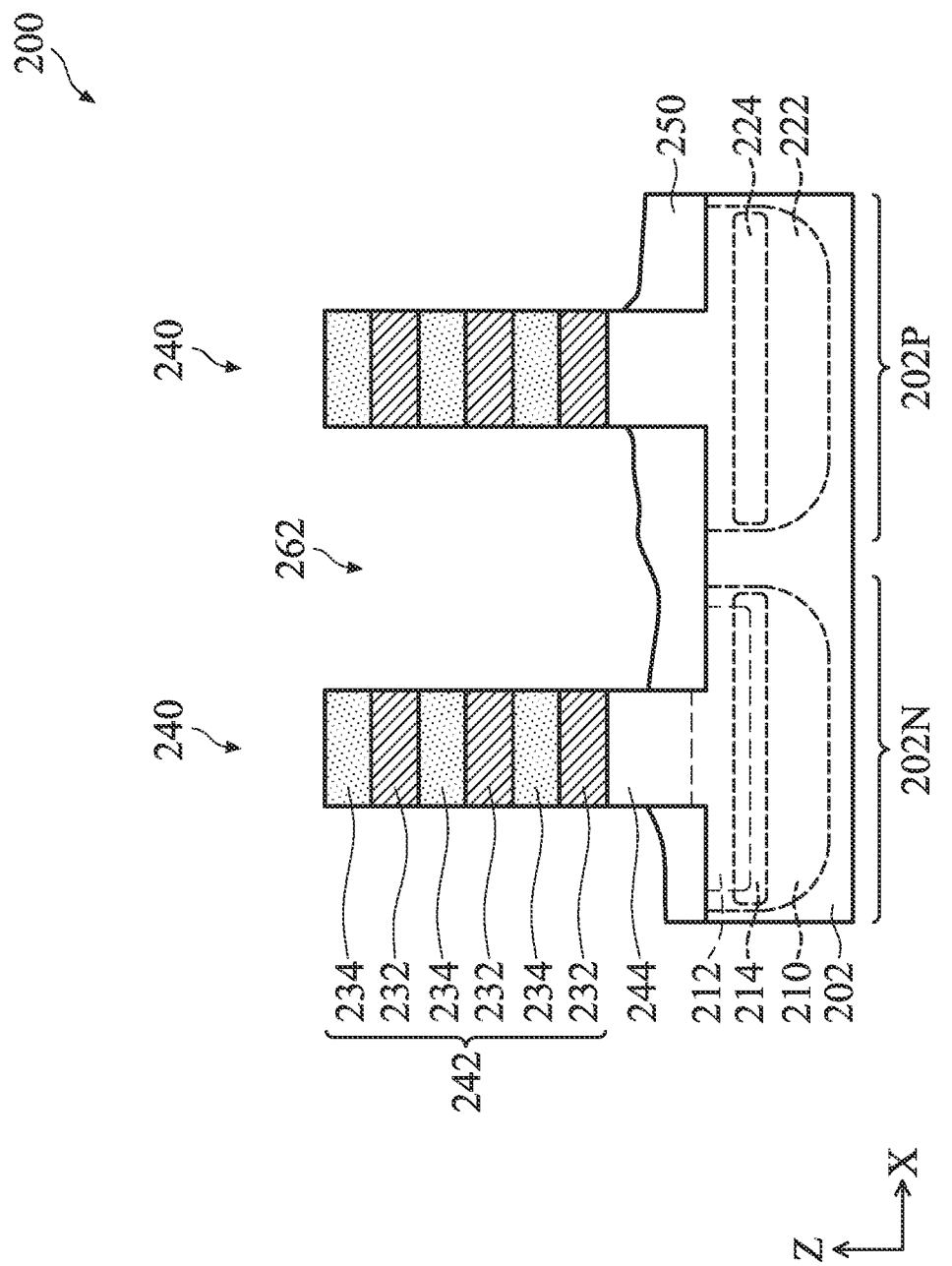
Figure 16:
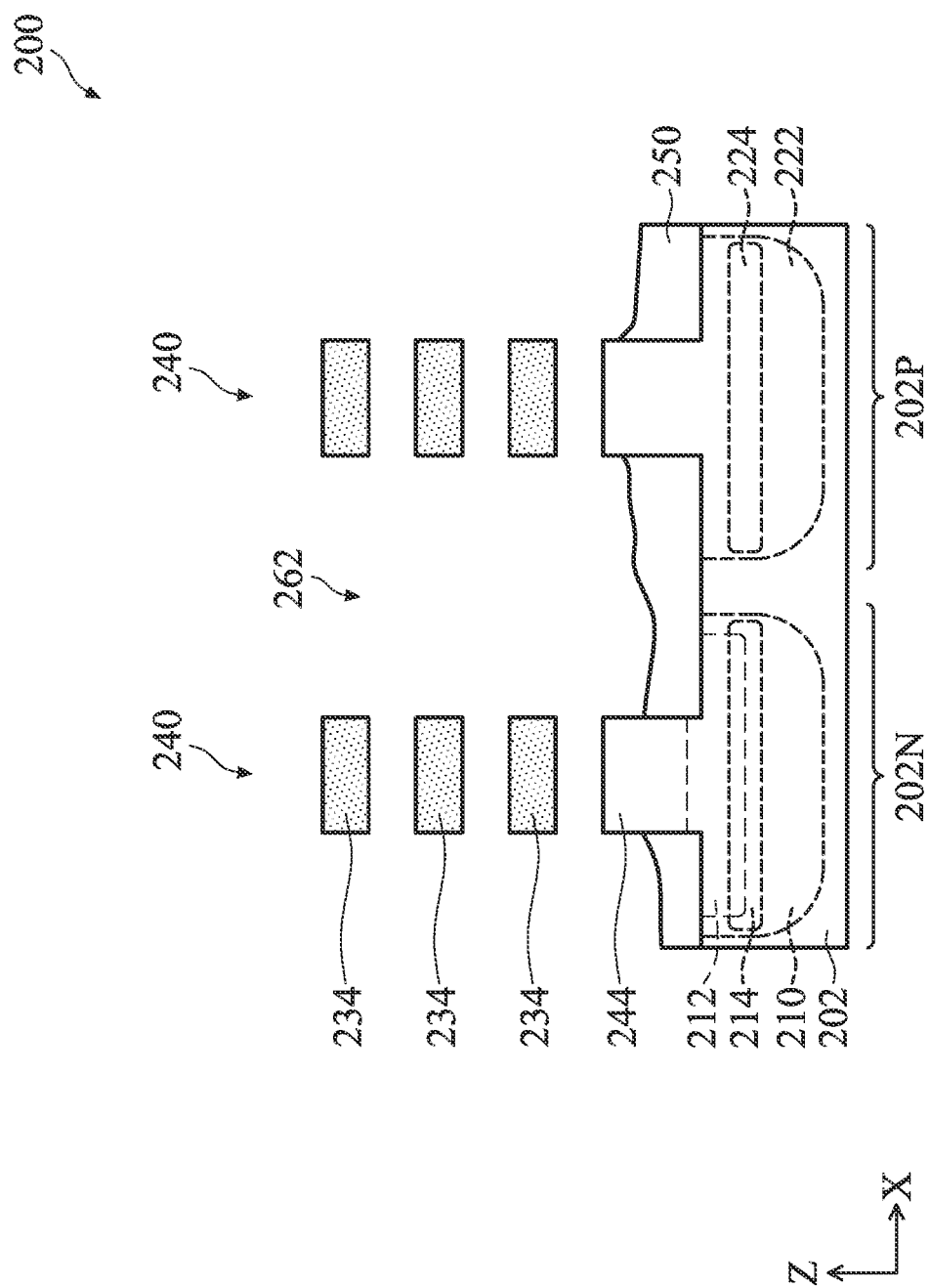

At operation 120, the method 100 (FIG. 2A) removes the dummy gate structure 260 and the sacrificial layers 232. The dummy gate structure 260 exposed at the conclusion of operation 118 is removed from the semiconductor device 200 by a selective etching process, as shown in FIG. 15. The selective etching process may be a selective wet etching process, a selective dry etching process, or a combination thereof. In the depicted embodiment, the selective etching process selectively removes the dummy dielectric layer and the dummy electrode without substantially damaging the fin structures 240 and the STI features 250. The removal of the dummy gate structure 260 results in gate trenches 262 over the channel regions. After the removal of the dummy gate structure 260, the channel layers 234 and the sacrificial layers 232 in the channel regions are exposed in the gate trenches 262. Subsequently, the sacrificial layers 232 are selectively removed from the gate trenches 262 to release the channel layers 234, as shown in FIG. 16. The selective removal of the sacrificial layers 232 may be implemented by selective dry etching, selective wet etching, or other selective etching processes. In some embodiments, the selective wet etching includes ammonium hydroxide ($NH_4OH$), hydrogen fluoride (HF), hydrogen peroxide ($H_2O_2$), or a combination thereof (e.g. an APM etch that includes an ammonia hydroxide-hydrogen peroxide-water mixture). In some alternative embodiments, the selective removal includes silicon germanium oxidation followed by a silicon germanium oxide removal. For example, the oxidation may be provided by ozone clean and then silicon germanium oxide removed by an etchant such as $NH_4OH$. At the conclusion of operation 120, the vertically stacked channel layers 234 are released in the channel regions of the to-be-formed GAA transistors.

Figure 17:
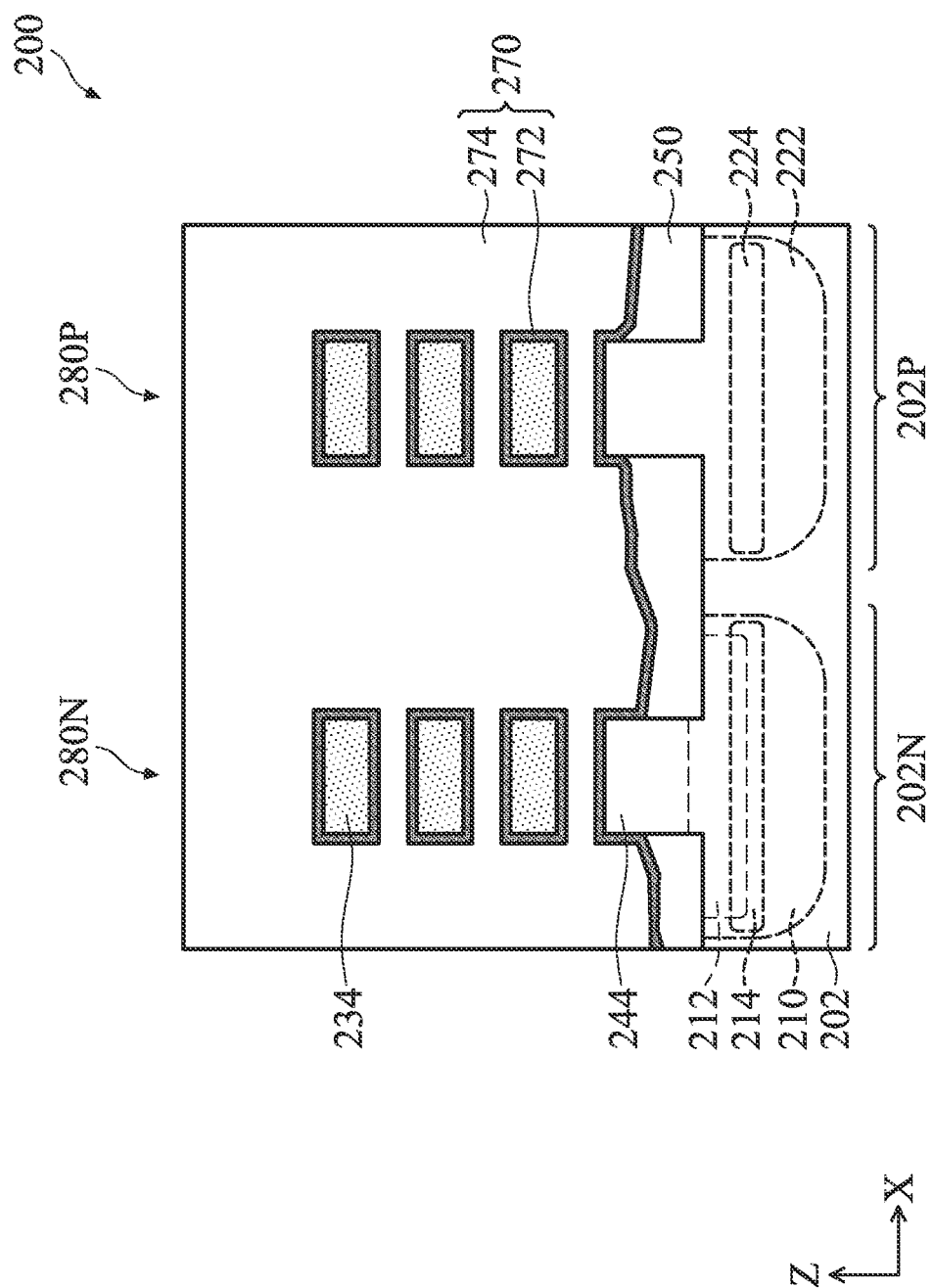

At operation 122, the method 100 (FIG. 2A) forms a metal gate structure 270 in the gate trenches 262 wrapping each of the channel layers 234 in the channel region, thereby forming an n-type GAA transistor 280N in the NMOS region 202N and a p-type GAA transistor 280P in the PMOS region 202P, as shown in FIG. 17. The metal gate structure 270 also engages the top portion of the mesa 244. The metal gate structure 270 includes a gate dielectric layer 272 wrapping each channel layers 234 in the channel region and a gate electrode layer 274 formed on the gate dielectric layer. In some embodiments, the gate dielectric layer 272 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTIO, HfZrO, zirconium oxide, aluminum oxide, titanium oxide, hafnium dioxide-alumina ($HfO_2$-$Al_2O_3$) alloy, other suitable high-k dielectric materials, and/or combinations thereof. In some embodiments, the gate dielectric layer 272 includes an interfacial layer formed between the channel layers 234 and the dielectric material. The gate dielectric layer 272 may be formed by CVD, ALD or any suitable method. In one embodiment, the gate dielectric layer is formed using a highly conformal deposition process such as ALD in order to ensure the formation of a gate dielectric layer having a uniform thickness around each channel layers. The gate electrode layer 274 is formed on the gate dielectric layer to surround each channel structure. The gate electrode layer 274 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer 274 may be formed by CVD, ALD, electro-plating, or other suitable method. In certain embodiments of the present disclosure, one or more work function adjustment layers are interposed between the gate dielectric layer 272 and the gate electrode layer 274. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-type GAA transistor 280N, one or more of TaN, TaAlC, TiN, TiC, Co, TiAl, HfTi, TiSi and TaSi is used as the work function adjustment layer, and for the p-type GAA transistor 280P, one or more of TiAlC, Al, TiAl, TaN, TaAlC, TIN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

Figure 18:
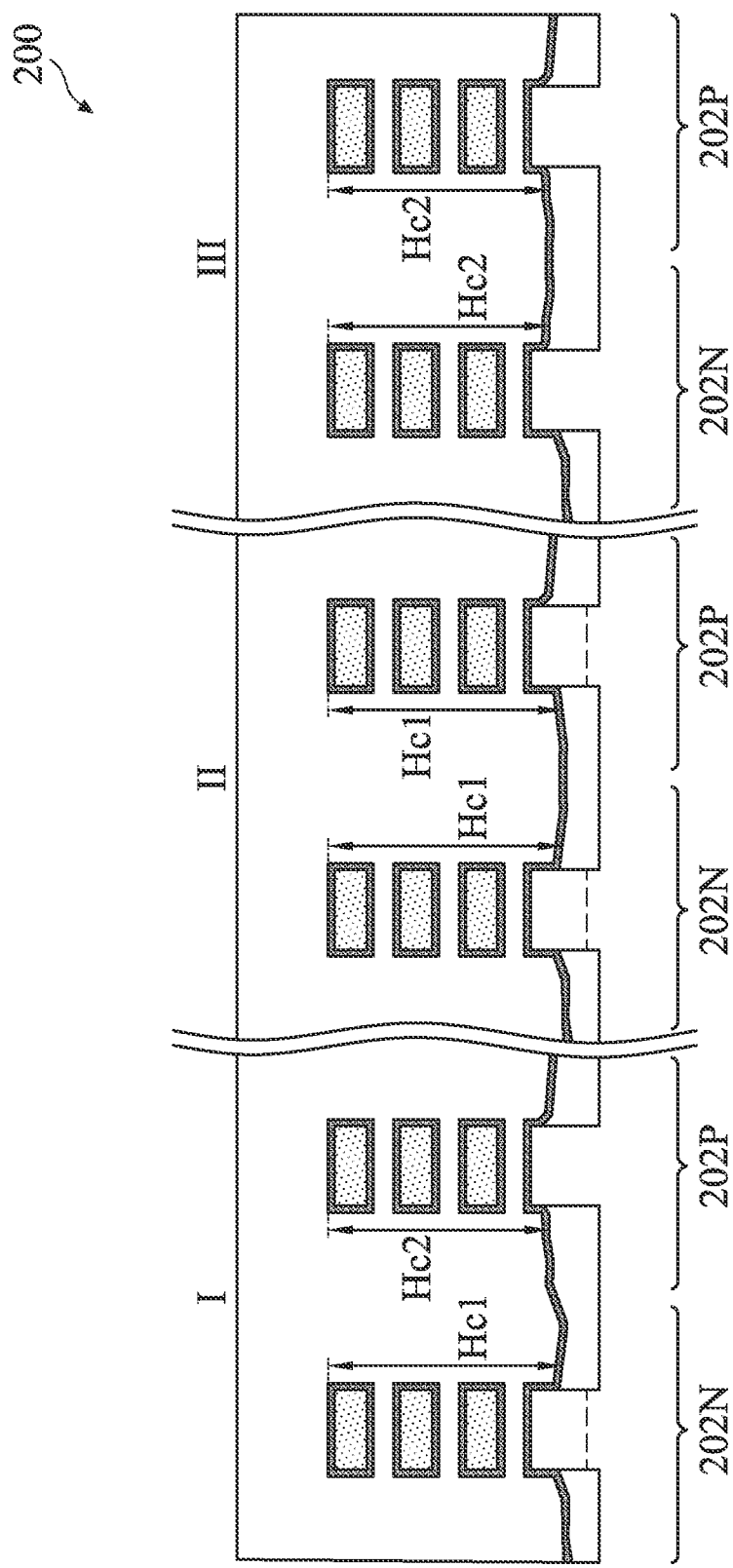

The further recessed top surface of the STI regions 250 in the NMOS region 202N exposes a higher channel height of the channel region, allowing the n-type GAA transistor 280N have a stronger drive current capability. Meanwhile, the lower channel height of the p-type GAA transistor 280P has less portion of the mesa 244 to expose under the gate drive and exhibits a better leakage current suppression performance. Such combination is suitable for some SRAM applications. The semiconductor device 200 may further include other CMOS pairs of varied channel height combinations. Referring to FIG. 18, by adjusting etch rates in different areas of the STI regions, such as by adjusting amount of dopant diffused into different areas of the STI regions, the semiconductor device 200 may include a first area I suitable for general SRAM applications where the n-type transistor has an enlarged channel height Hc1 and the p-type transistor has an unadjusted channel height Hc2, a second area II suitable for high current SRAM applications where the n-type and the p-type transistors both have an enlarged channel height Hc1, and a third area III suitable for low-leakage SRAM application where the n-type and the p-type transistors both have an unadjusted channel height Hc2. In some embodiments, the enlarged channel height Hc1 ranges from about 65 nm to about 75 nm, and the unadjusted channel height Hc2 ranges from about 50 nm to about 60 nm.

Figure 19:
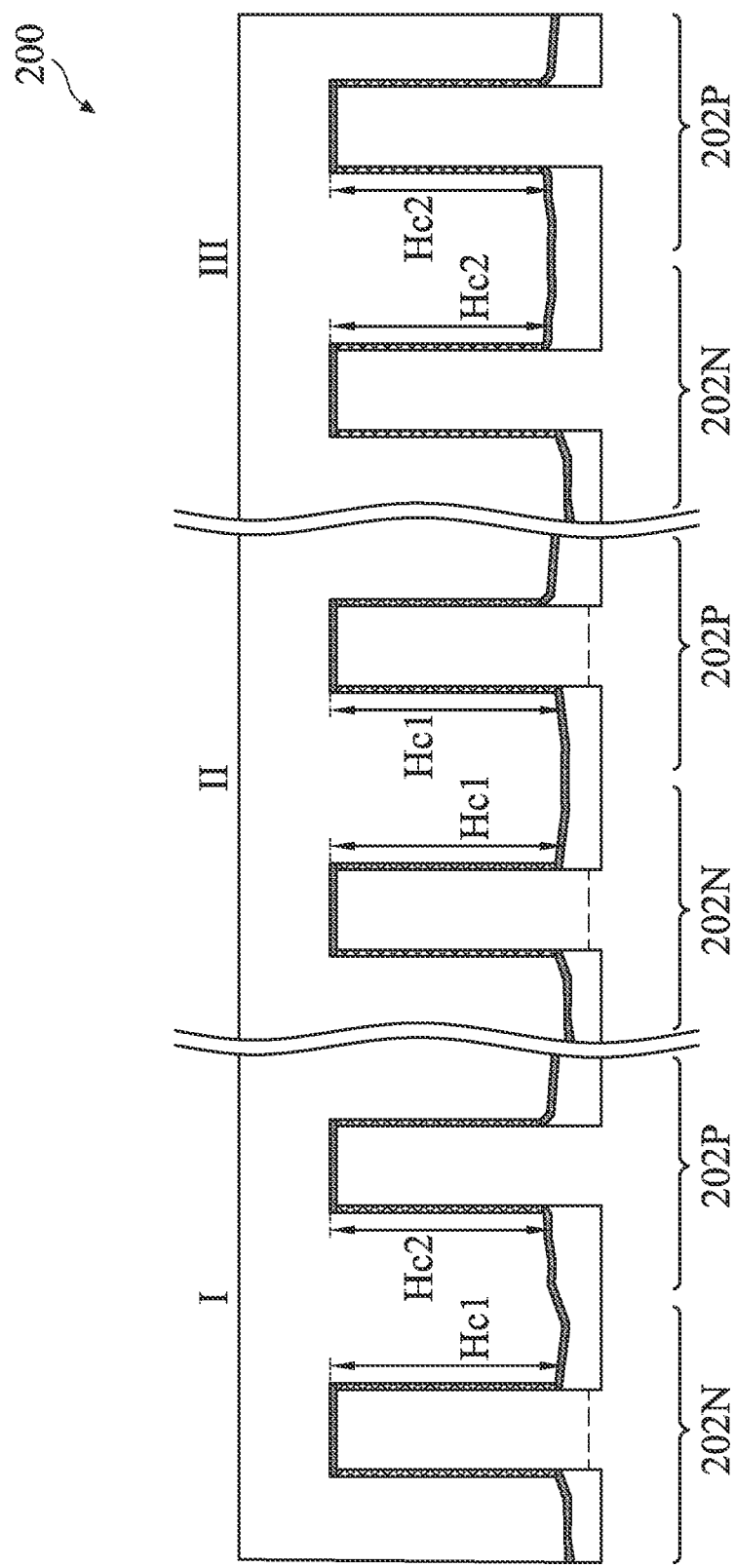

Further, although FIGS. 3-18 use GAA transistors as an example, those of ordinary skill in the art should appreciate that they may readily use the present disclosure as a basis for designing or modifying other processes and structures, such as FinFET transistors or another type of multi-gate transistors for carrying out the same purposes and/or achieving the same advantages of the embodiments introduced herein. As an example, FIG. 19 illustrates another embodiment of the semiconductor device 200 having FinFET transistors with different combinations of channel heights in different areas.

At operation 124, the method 100 (FIG. 2A) performs further processes to the semiconductor device 200 to form various features and regions known in the art. For example, subsequent processes may form various contacts, vias, metal lines, and multilayers interconnect features (e.g., metal layers and interlayer dielectrics) on the semiconductor device 200, configured to connect the various features to form a functional circuit that may include one or more multi-gate devices. In furtherance of the example, a multi-layer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 100, and some process steps described above may be replaced or eliminated in accordance with various embodiments of the method 100.

Figure 2A:
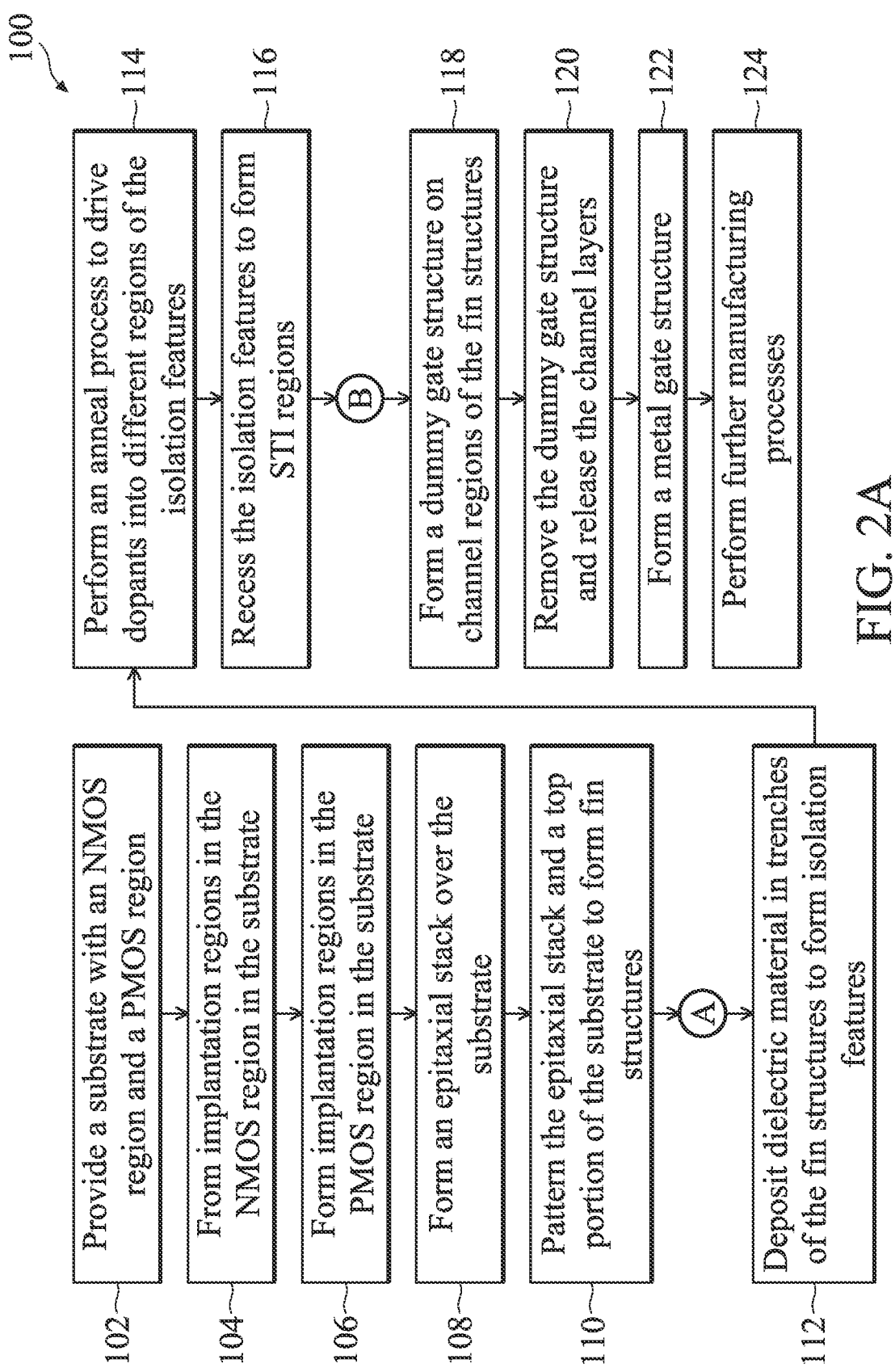
FIGS. 2A, 2B, 2C, and 2D illustrate flowcharts of some embodiments of an example method for making a semiconductor device in accordance with some embodiments of the present disclosure.
Figure 2B:
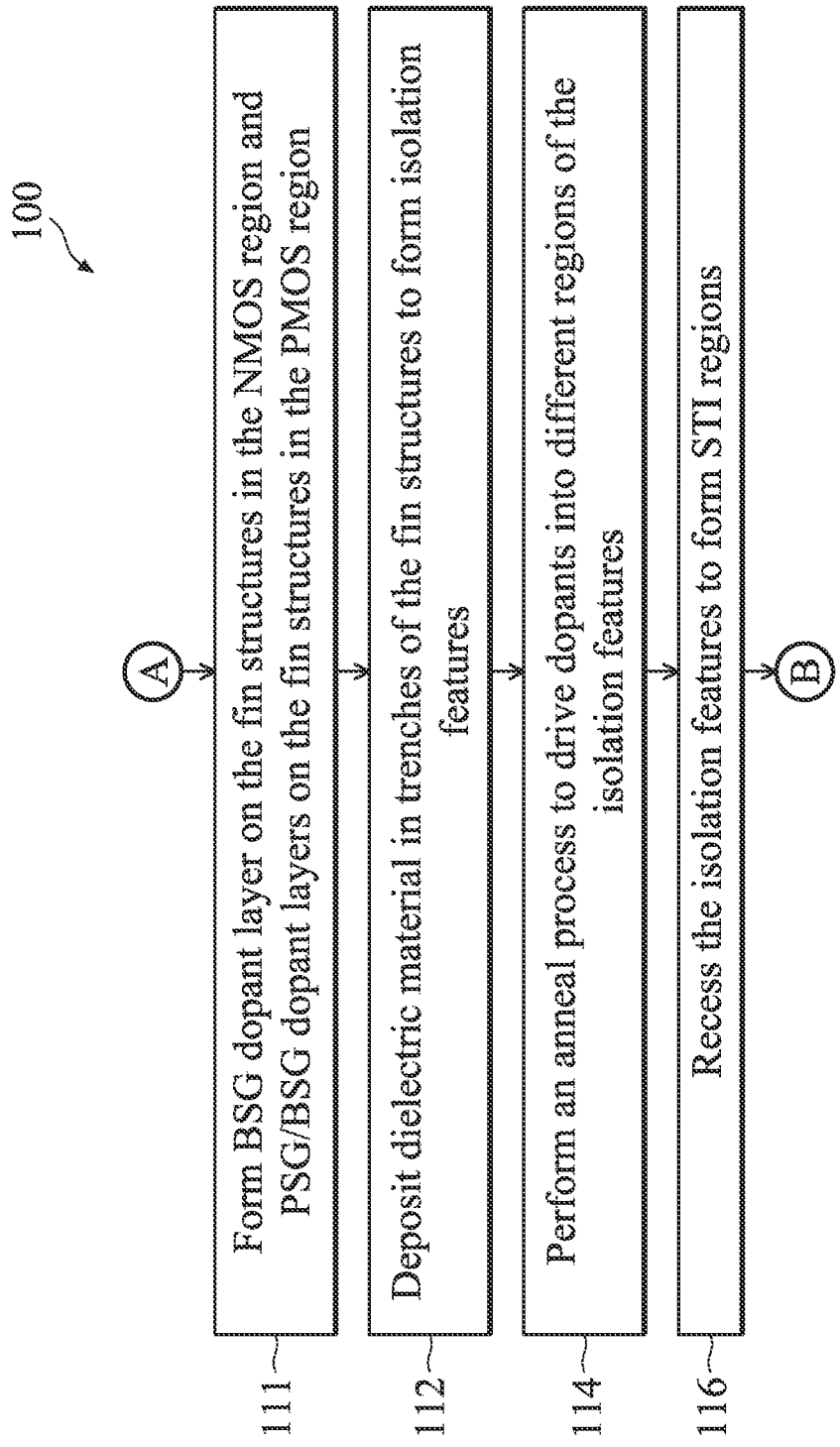
Figure 20:
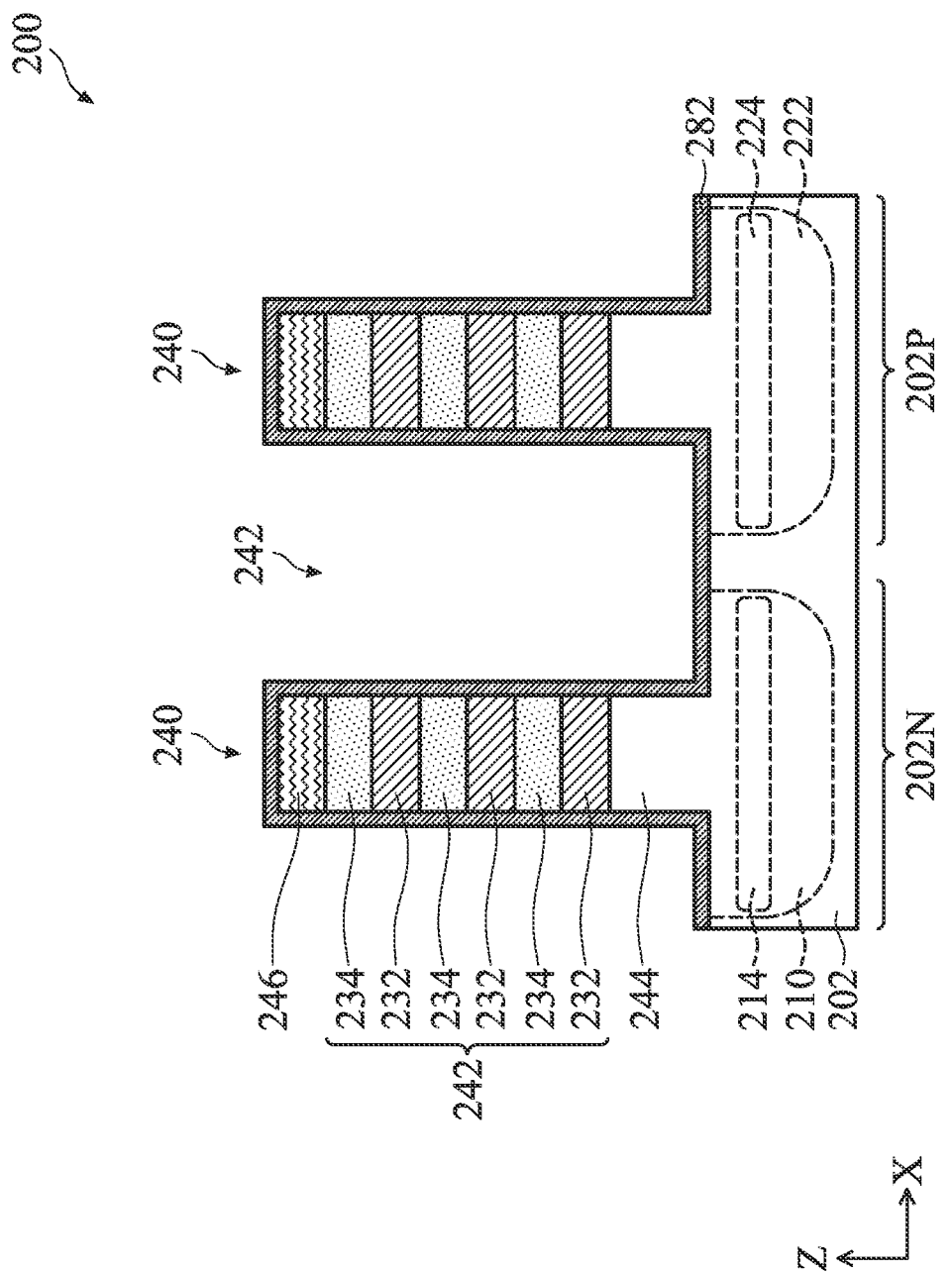
Figure 21:
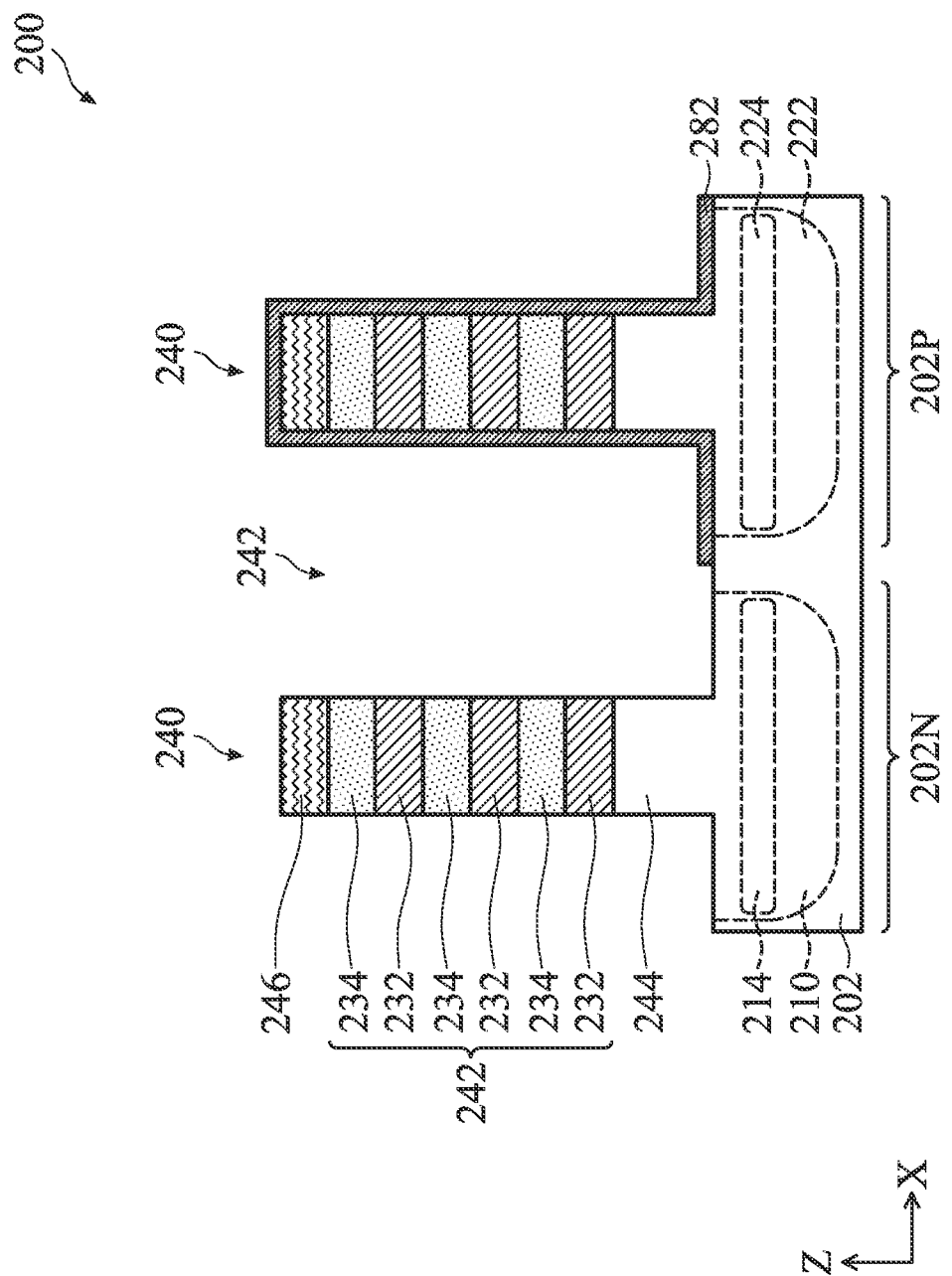
Figure 22:
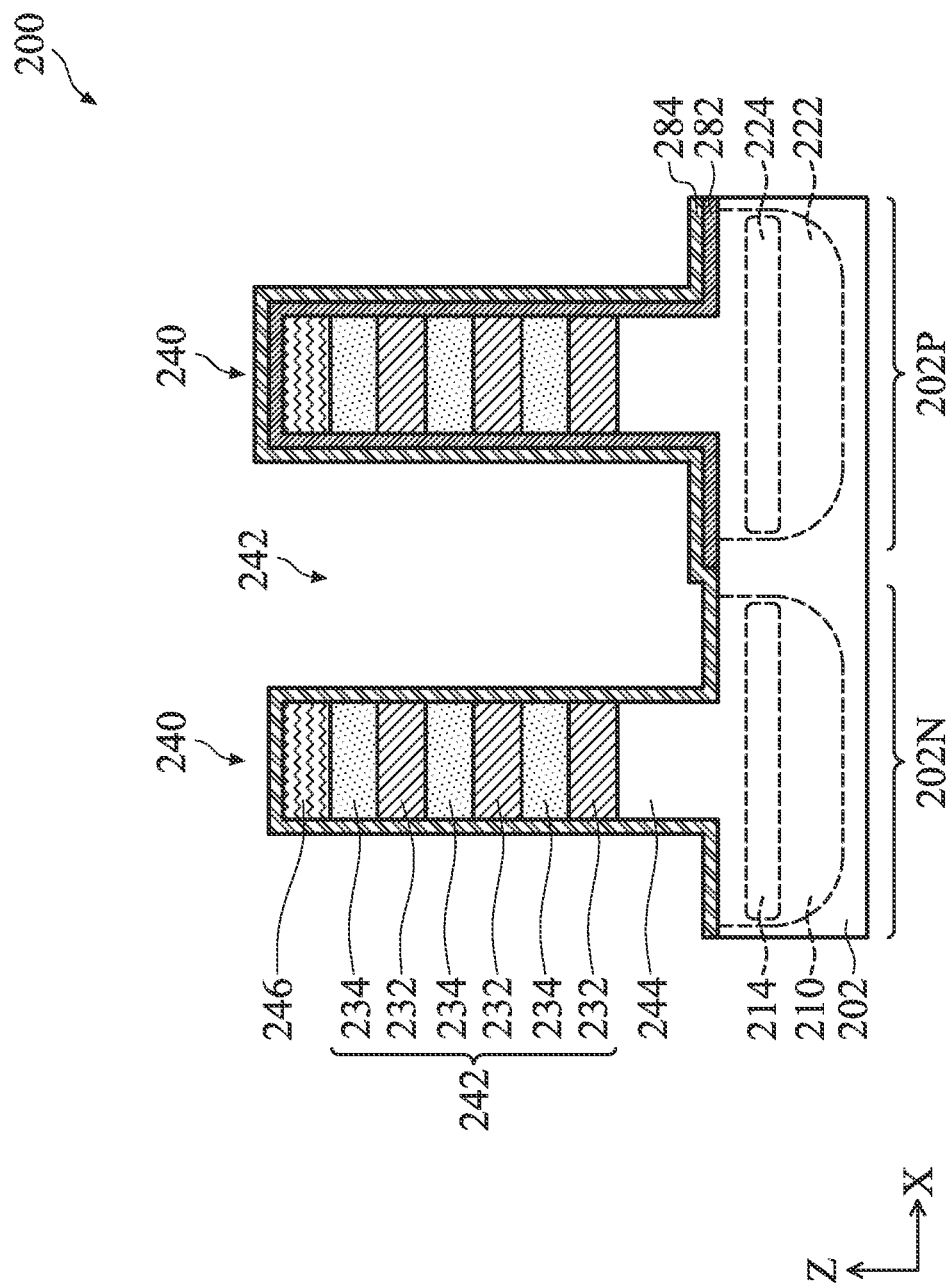
Figure 23:
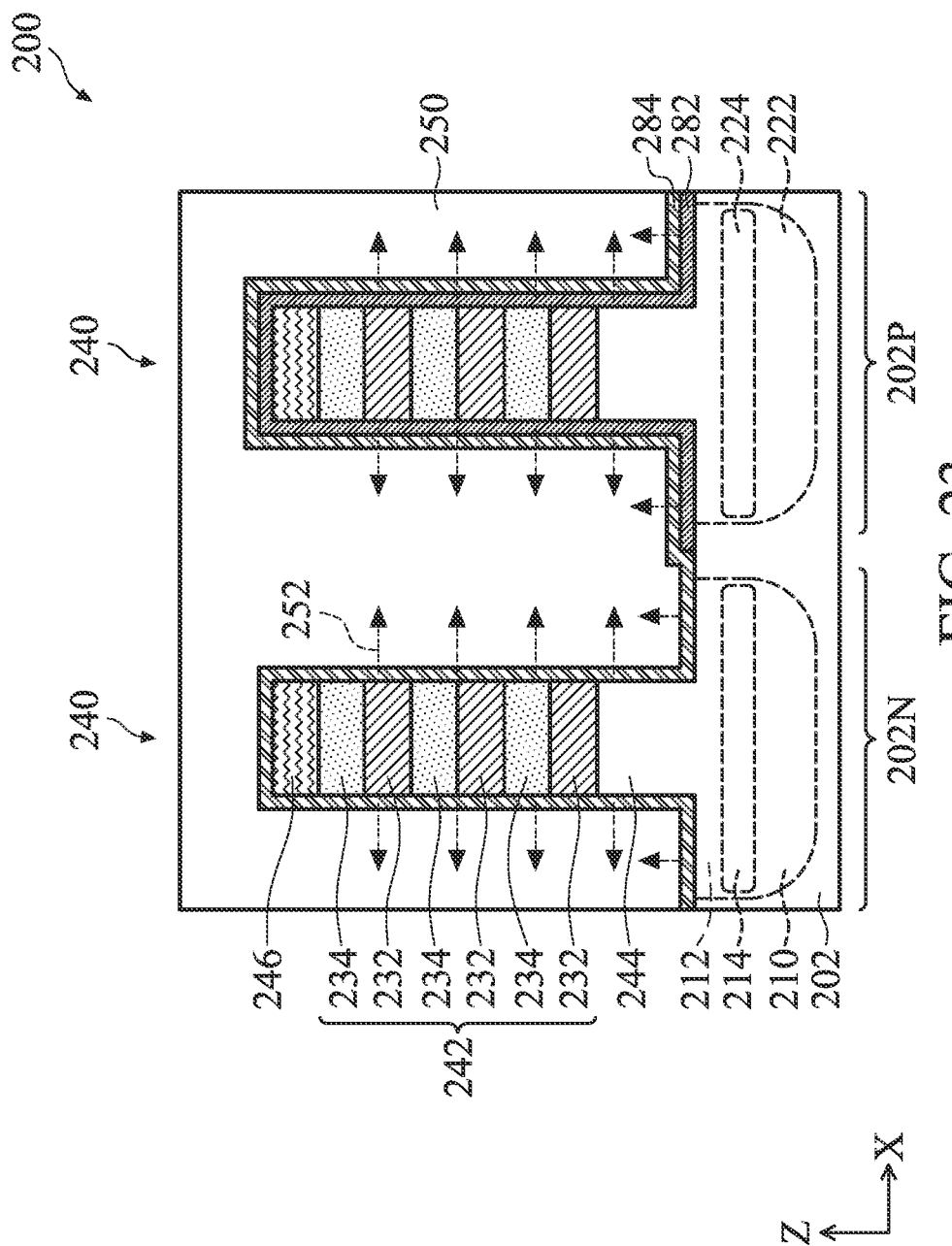

Reference is now made to FIG. 2B, which illustrates a flow chart for an alternative embodiment of the method 100. In the alternative embodiment of the method 100, the method 100 proceed through operations 102-110, while the formation of the high-doping region 212 is skipped at operation 104. After operation 110, the method 100 proceeds to operation 111 where dopant layers are formed on the fin structures 240. Referring to FIG. 20, a first dopant layer 282 is blanket deposited on the sidewalls and top surfaces of the fin structures 240. In the illustrated embodiment, the first dopant layer 282 is a phosphosilicate glass (PSG), and/or other materials that comprise n-type dopant selected from phosphorous, arsenic, antimony, and combinations thereof. A dopant concentration in the first dopant layer 282 may range from about $10^{17}/cm^3$ and about $10^{21}/cm^3$. Referring to FIG. 21, the first dopant layer 282 is removed from the NMOS region 202N. The removal of the first dopant layer 282 may include forming an etch mask over the semiconductor device 200 with an opening exposing the NMOS region 202N, etch the first dopant layer 282 though the opening in the etch mask, and remove the etch mask after the removal of the first dopant layer 282 from the NMOS region 202N. Referring to FIG. 22, a second dopant layer 284 is blanket deposited on the sidewall and top surfaces of the fin structures 240 in the NMOS region 202N and covers the first dopant layer 282 in the PMOS region 202P. In the illustrated embodiment, the second dopant layer 284 is a borosilicate glass (BSG), and/or other materials that comprise p-type dopant selected from boron, indium, and combinations thereof. A dopant concentration in the second dopant layer 284 may range from about $10^{17}/cm^3$ and about $10^{21}/cm^3$.

Figure 24:
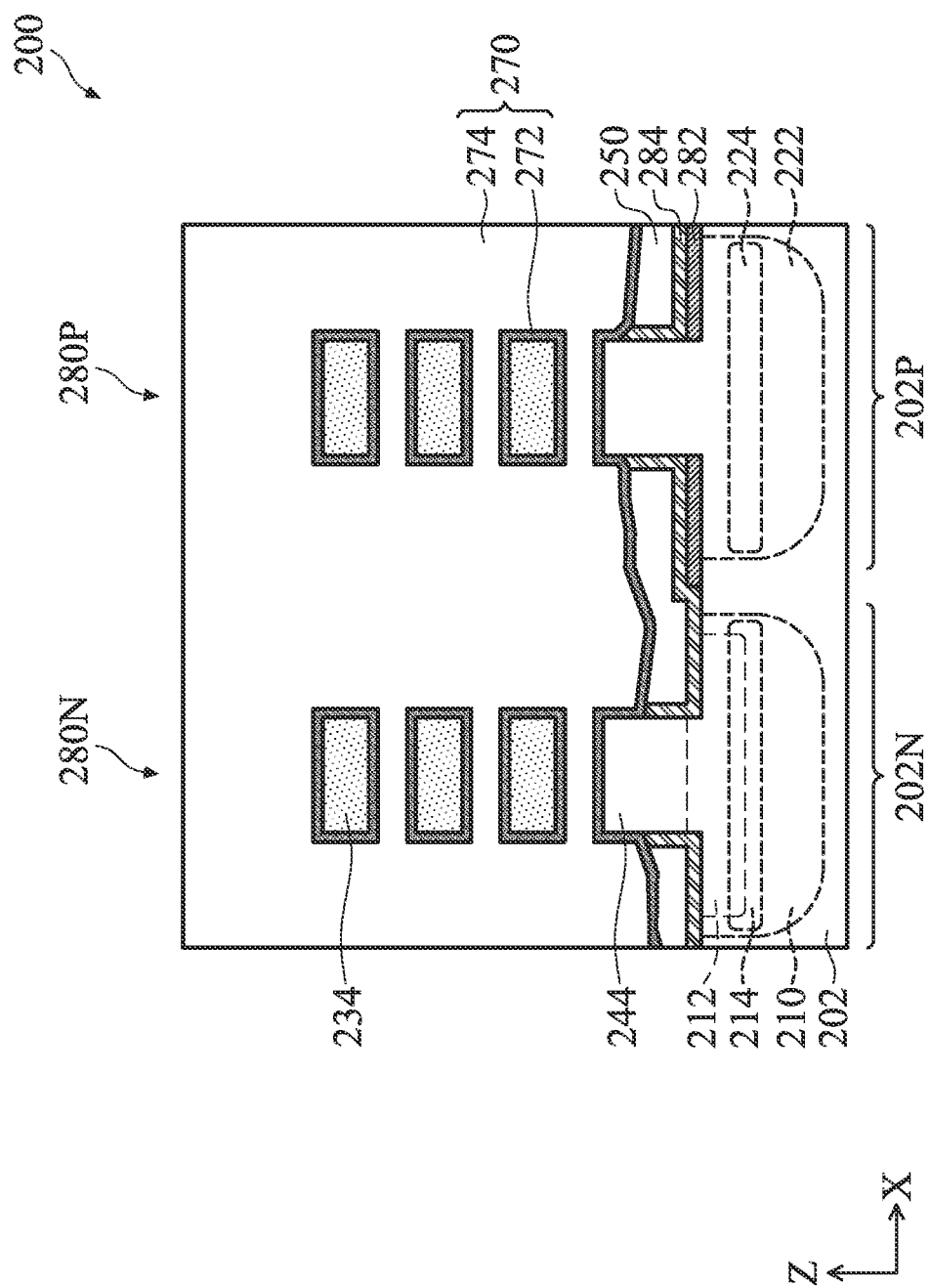

After operation 111, the method 100 proceeds to operations 112-116. At operation 116, the anneal process causes the diffusion of the dopants in the first dopant layer 282 and the second dopant layer 284 into the isolation features 250, represented by arrows 252 in FIG. 23. Since the diffusion mainly occurs from sidewalls and top surfaces of the fin structures 240, top portions of the isolation features 250 are also doped. In the NMOS region 202N, the p-type dopant adjusts the etch rate of the isolation features 250. In the PMOS region 202P, since both the p-type dopant and n-type dopant diffuse into the isolation features 250, the net effect of etch rate adjustment is diminished. An overall effect is that the etch rate in the NMOS region 202N becomes higher than in the PMOS region 202P. After operation 116, the method 100 proceeds to operations 118-124. The semiconductor device 200 at the conclusion of operation 122 is illustrated in FIG. 24.

Figure 2C:
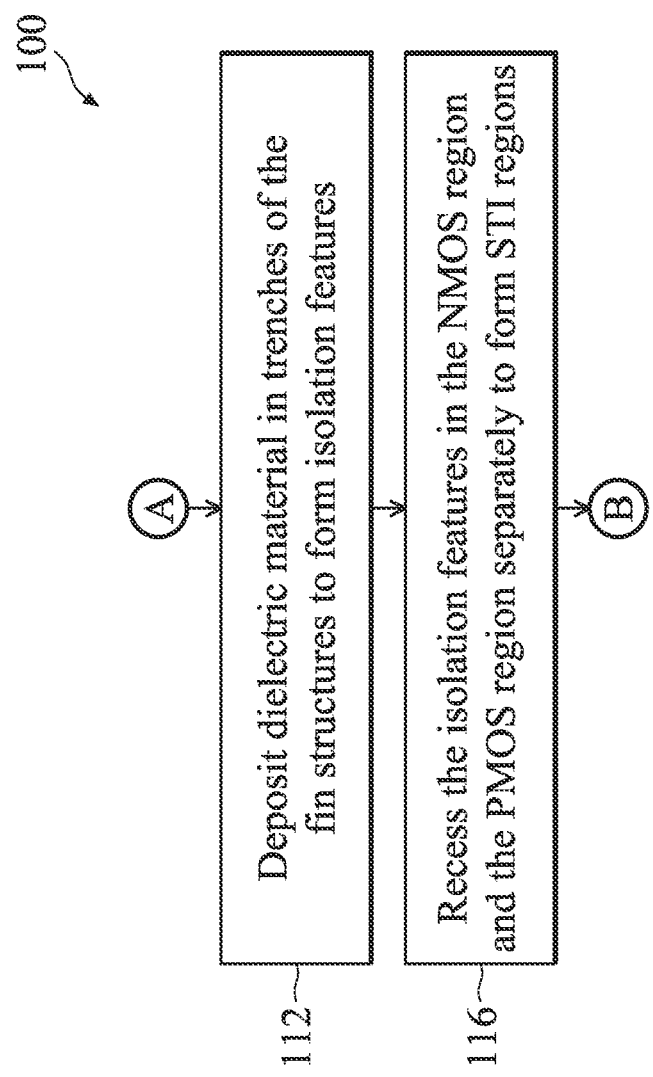
Figure 25:
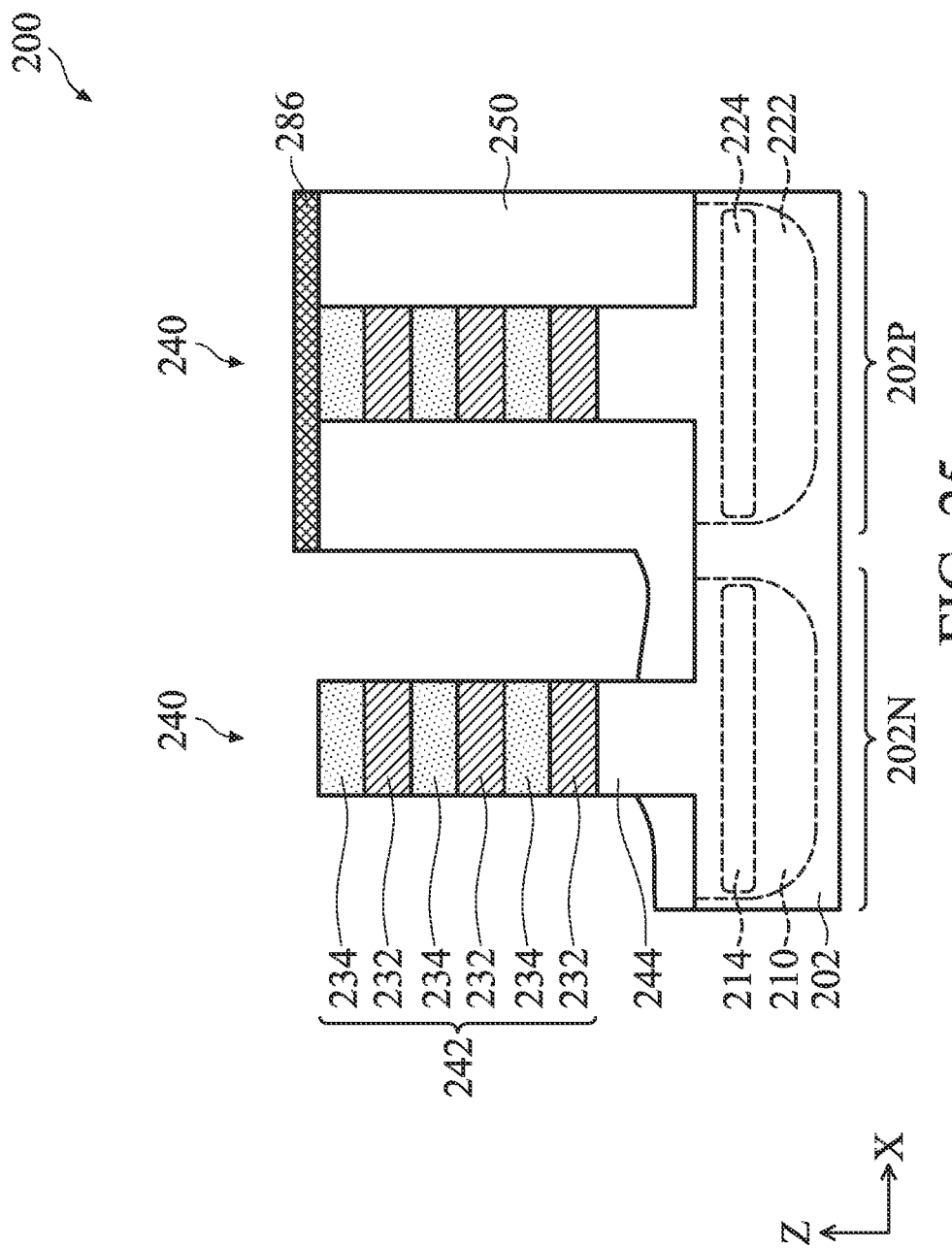
Figure 26:
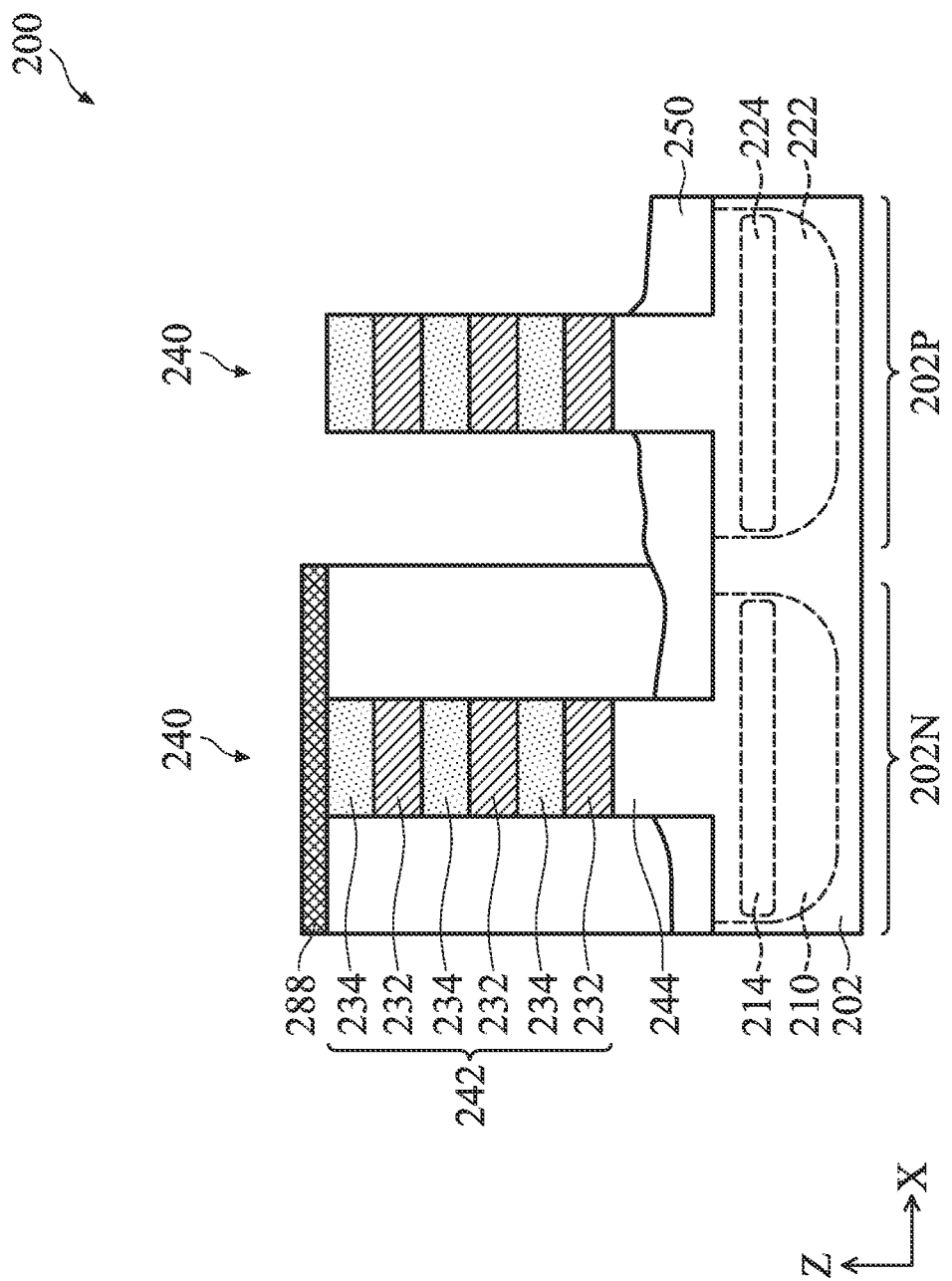
Figure 27:
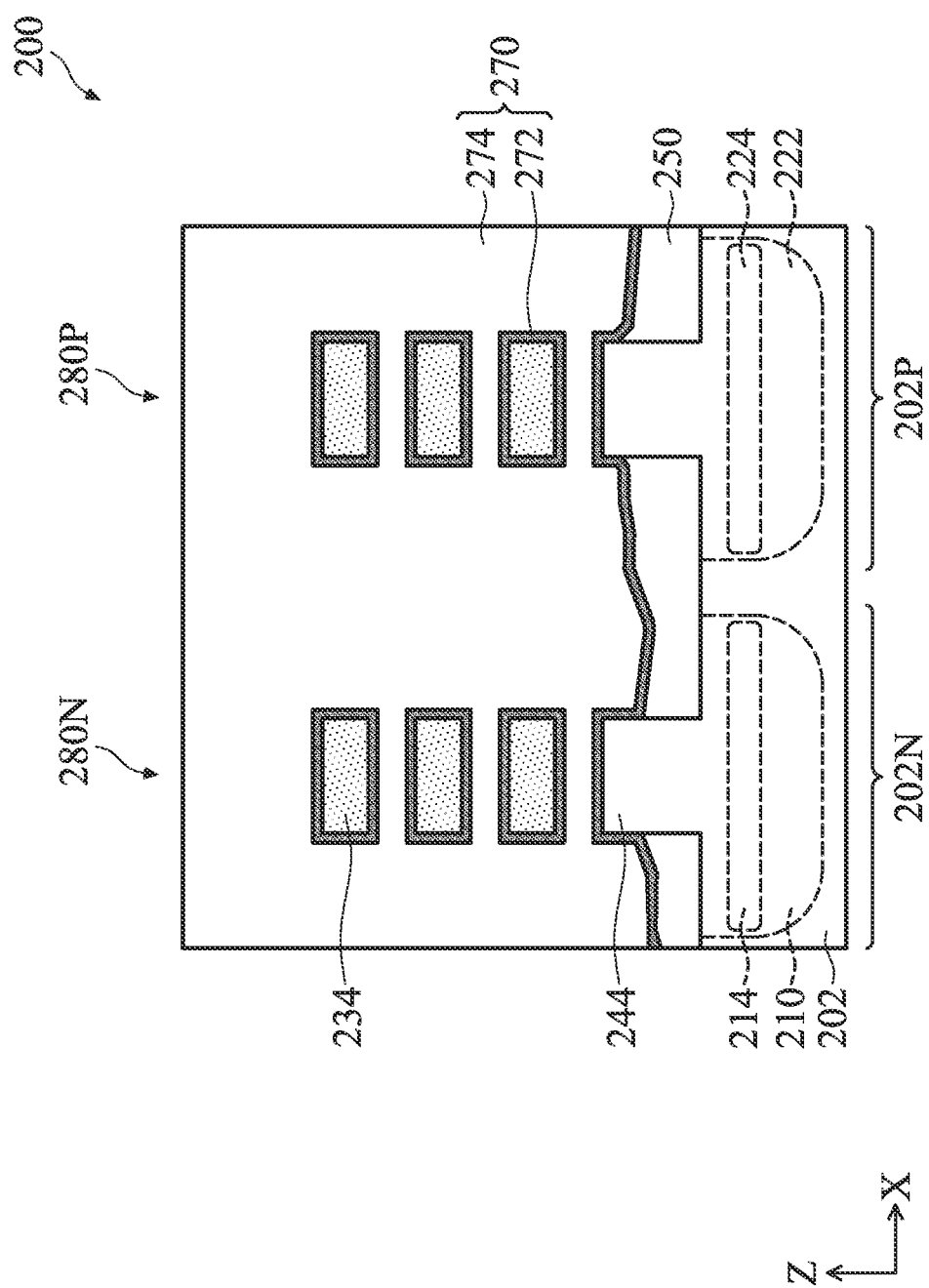

Reference is now made to FIG. 2C, which illustrates a flow chart for a third embodiment of the method 100. In this alternative embodiment of the method 100, the method 100 proceed through operations 102-112, while the formation of the high-doping region 212 is skipped at operation 104. After the deposition of dielectric material to form isolation features 250 at operation 112, the method 100 proceeds to operation 116 to recess the isolation features 250. At operation 116, instead of recessing the isolation features 250 in the NMOS region 202N and the PMOS region 202P simultaneously, the method 100 forms a first etch mask 286 to limit the etch back process in the NMOS region 202N, as shown in FIG. 25; subsequently, the method 100 forms a second etch mask 288 to limit the etch back process in the PMOS region 202P, as shown in FIG. 26. By performing etch back process in the NMOS region 202N and the PMOS region 202P sequentially, the etch time in different regions can be individually adjusted to achieve different recessed depths and to achieve different top surface profiles in the respective region individually, such as concave, flat, or convex. For example, a convex profile in the NMOS region 202N and a concave profile in the PMOS region 202P. After operation 116, the method 100 proceeds to operations 118-124. The semiconductor device 200 at the conclusion of operation 122 is illustrated in FIG. 27.

Figure 2D:
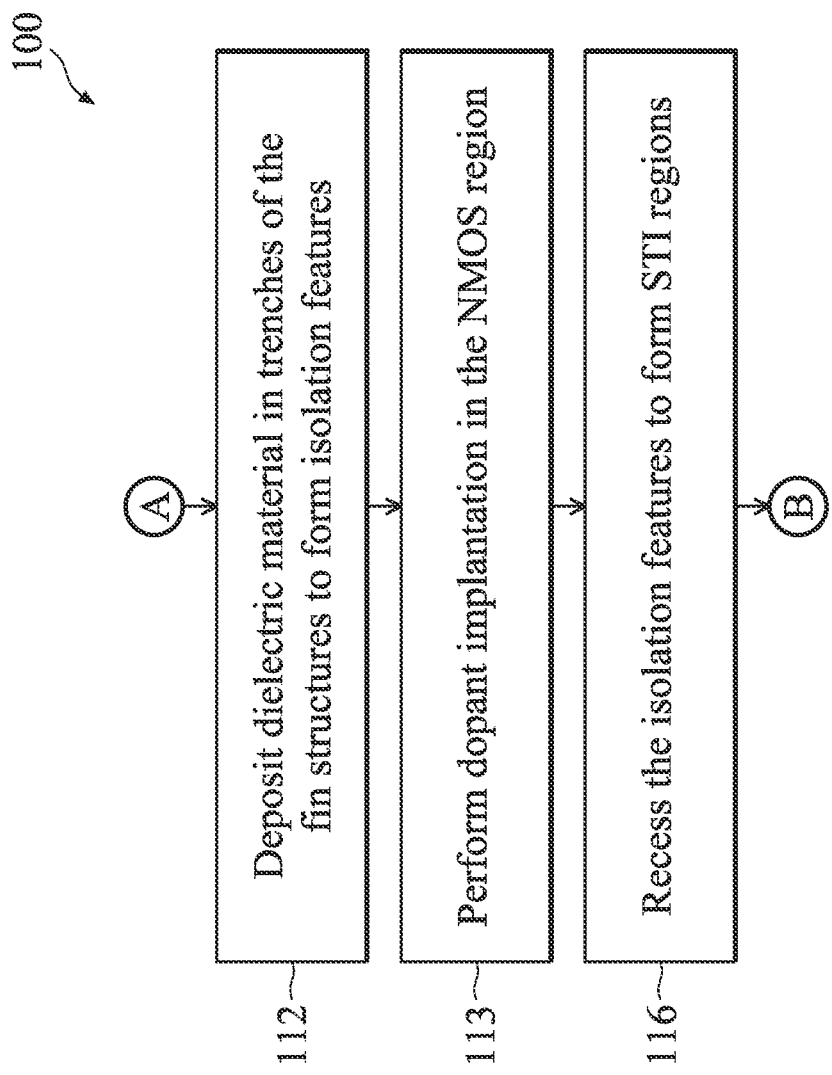
Figure 28:
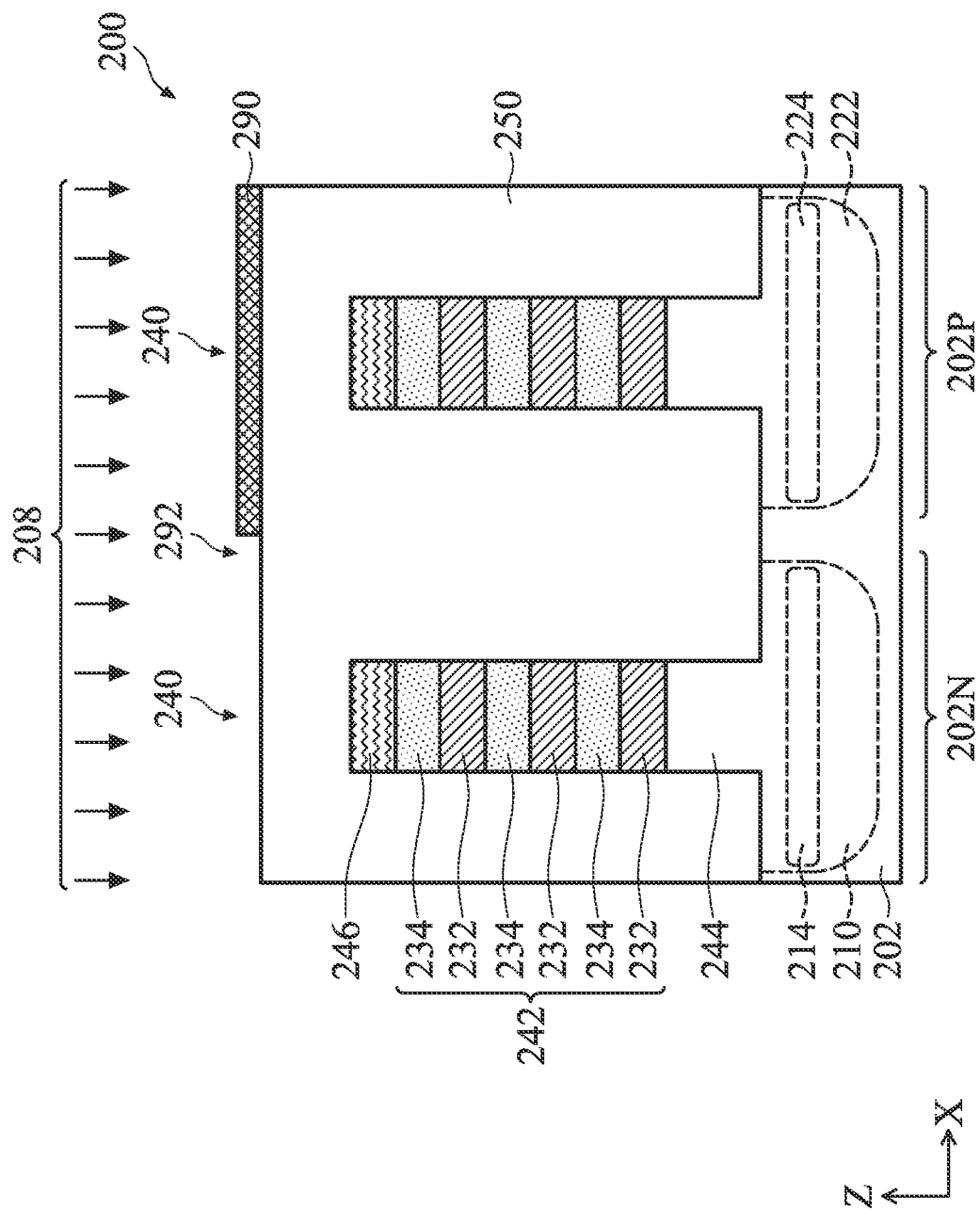
Figure 29:
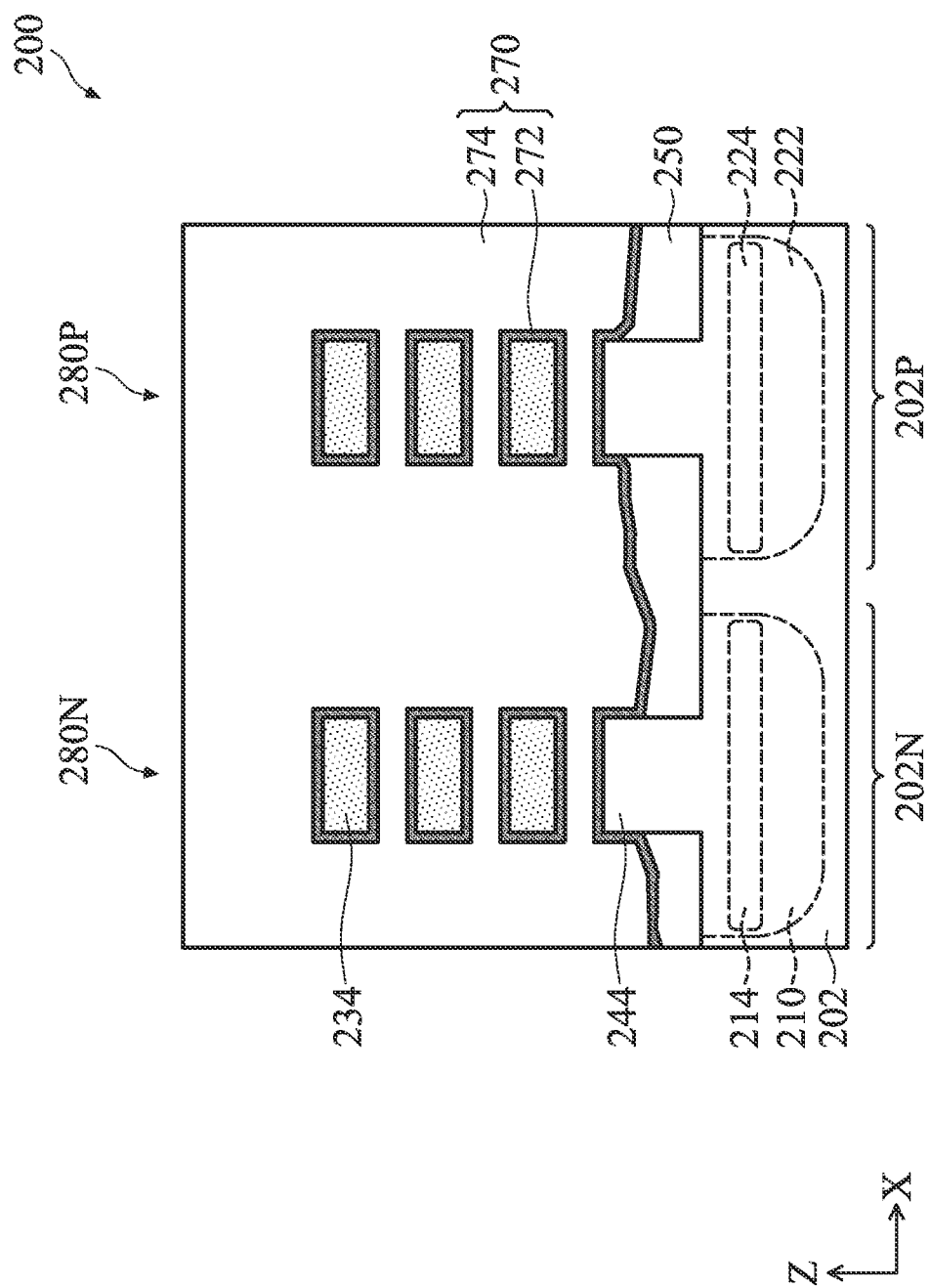

Reference is now made to FIG. 2D, which illustrates a flow chart for a fourth embodiment of the method 100. In this alternative embodiment of the method 100, the method 100 proceed through operations 102-112, while the formation of the high-doping region 212 is skipped at operation 104. After the deposition of the dielectric material of the isolation features 250, the method 100 proceeds to operation 113 to perform a dopant implantation to the NMOS region 202N. Referring to FIG. 28, an implantation mask 290 is formed over the semiconductor device 200. In some embodiments, the implantation mask 290 is formed of photo resist, which is coated and then patterned to form an opening 292 overlying the NMOS region 202N. A p-type dopant implantation (marked as 208) is then performed to adjust the etch rate of the isolation features 250. The p-type dopant may include boron, indium, or combinations thereof. The implantation may be performed using an energy in the range between about 50 keV and about 150 keV. The p-type dopant concentration may be equal to or less than $10^{20}$ cm$^{-3}$, such as in the range between about $10^{17}/cm^3$ and about $10^{20}/cm^3$. As a comparison, the isolation features 250 in the PMOS region 202P is substantially dopant free. The implantation mask 290 is then removed, such as by an acceptable ashing process. An anneal process may also be performed to active the dopants. After operation 113, the method 100 proceeds to operations 116-124. The semiconductor device 200 at the conclusion of operation 122 is illustrated in FIG. 29.

Although not intended to be limiting, one or more embodiments of the present disclosure provide many benefits to a semiconductor device and the formation thereof. The present disclosure provides methods of forming multi-gate transistors in different regions of the semiconductor device with different channel heights and different top surface profiles of STI regions to fine tune device performance. Furthermore, the embodiments of the method of adjusting etch rate of the isolation features and accordingly achieving different curvature profiles in the STI regions can be easily integrated into existing semiconductor fabrication processes.

In one exemplary aspect, the present disclosure is directed to a method. The method includes providing a semiconductor substrate having a first region and a second region, epitaxially growing a semiconductor layer above the semiconductor substrate, patterning the semiconductor layer to form a first fin in the first region and a second fin in the second region, depositing a dielectric material layer on sidewalls of the first and second fins, performing an anneal process in driving dopants into the dielectric material layer, such that a dopant concentration in the dielectric material layer in the first region is higher than that in the second region, and performing an etching process to recess the dielectric material layer, thereby exposing the sidewalls of the first and second fins. A top surface of the recessed dielectric material layer in the first region is lower than that in the second region. In some embodiments, the method further includes prior to the epitaxially growing of the semiconductor layer, implanting a first dopant in the semiconductor substrate in the first region, thereby forming a doped region in the semiconductor substrate. The driving of the dopants into the dielectric material layer includes driving the first dopant in the doped region into a bottom portion of the dielectric material layer. In some embodiments, after the anneal process, a top portion of the dielectric material layer is substantially free of the first dopant from the doped region. In some embodiments, the patterning of the semiconductor layer also patterns a top portion of the semiconductor substrate. The patterning of the semiconductor layer exposes the doped region. In some embodiments, the method further includes depositing a first dopant layer over the second fin and a second dopant layer over the first dopant layer in the second region, and depositing the second dopant layer over the first fin. The first and second dopant layers are of opposite types. In some embodiments, the driving of the dopants into the dielectric material layer includes driving dopants in the first and second dopant layers into top and bottom portions of the dielectric material layer. In some embodiments, after the dielectric material layer is recessed, a channel height provided by the first fin is larger than a channel height provided by the second fin. In some embodiments, after the dielectric material layer is recessed, the top surface of the recessed dielectric material layer has concave profiles with different concave depths in the first and second regions. In some embodiments, after the dielectric material layer is recessed, the top surface of the recessed dielectric material layer forms a first sidewall angle with respect to a sidewall of the first fin and a second sidewall angle with respect to a sidewall of the second fin, and the first sidewall angle is larger than the second sidewall angle. In some embodiments, the first sidewall angle is larger than about 55 degrees and the second sidewall angle is less than about 45 degrees. In some embodiments, the first region is for forming n-type transistors and the second region is for forming p-type transistors.

In another exemplary aspect, the present disclosure is directed to a method of manufacturing a multi-gate device. The method includes providing a semiconductor substrate having a first region and a second region, forming first and second fin structures protruding from the first and second regions, respectively, depositing a dielectric material layer on sidewalls and top surfaces of the first and second fins, after the depositing of the dielectric material layer, forming an implantation mask covering the dielectric material layer in the second region, performing an implantation process with the implantation mask to implant a dopant into the dielectric material layer in the first region, removing the implantation mask, and recessing the dielectric material layer in the first and second regions. In some embodiments, the first region is for forming n-type transistors and the second region is for forming p-type transistors, and the dopant is a p-type dopant. In some embodiments, after the implantation process, the dielectric material layer in the first region exhibits a higher etch rate than in the second region during the recessing of the dielectric material layer. In some embodiments, after the recessing of the dielectric material layer, the first fin structure has a higher sidewall exposed above the recessed dielectric material layer than that of the second fin structure.

In another exemplary aspect, the present disclosure is directed to a semiconductor device. The semiconductor device includes a semiconductor substrate, a plurality of first channel layers vertically stacked over a first mesa protruding from the semiconductor substrate, a plurality of second channel layers vertically stacked over a second mesa protruding from the semiconductor substrate, an isolation feature disposed on sidewalls of the first mesa and sidewalls of the second mesa, and a gate structure wrapping each of the first and second channel layers. A top surface of the isolation feature intersects the sidewalls of the first mesa at a first position and intersects the sidewalls of the second mesa at a second position higher than the first position. In some embodiments, a bottom portion of the first mesa has a higher dopant concentration than a bottom portion of the second mesa. In some embodiments, the first channel layers are part of an n-type transistor and the second channel layers are part of a p-type transistor, and the dopant concentration is of a p-type dopant. In some embodiments, the top surface of the isolation feature forms a first sidewall angle with respect to the sidewalls of the first mesa and a second sidewall angle with respect to the sidewalls of the second mesa, and the first sidewall angle is larger than the second sidewall angle. In some embodiments, the second position is higher than the first position for about 5 nm to about 25 nm.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
providing a semiconductor substrate having a first region and a second region;
forming a doped region with dopants in the first region of the semiconductor substrate;
epitaxially growing a semiconductor layer above the semiconductor substrate;
patterning the semiconductor layer to form a first fin in the first region and a second fin in the second region;
depositing a dielectric material layer on sidewalls of the first and second fins;
after the forming of the doped region, performing an anneal process in driving the dopants into the dielectric material layer, such that a dopant concentration in the dielectric material layer in the first region is higher than that in the second region; and
performing an etching process to recess the dielectric material layer, thereby exposing the sidewalls of the first and second fins, wherein a top surface of the recessed dielectric material layer in the first region is lower than that in the second region.

2. The method of claim 1,
wherein the driving of the dopants into the dielectric material layer includes driving the dopant in the doped region into a bottom portion of the dielectric material layer.

3. The method of claim 2, wherein after the anneal process, a top portion of the dielectric material layer is substantially free of the dopant from the doped region.

4. The method of claim 1, wherein the patterning of the semiconductor layer also patterns a top portion of the semiconductor substrate, wherein the patterning of the semiconductor layer exposes the doped region.

5. The method of claim 1, wherein after the dielectric material layer is recessed, a channel height provided by the first fin is larger than a channel height provided by the second fin.

6. The method of claim 1, wherein after the dielectric material layer is recessed, the top surface of the recessed dielectric material layer has concave profiles with different concave depths in the first and second regions.

7. The method of claim 1, wherein after the dielectric material layer is recessed, the top surface of the recessed dielectric material layer forms a first sidewall angle with respect to a sidewall of the first fin and a second sidewall angle with respect to a sidewall of the second fin, wherein the first sidewall angle is larger than the second sidewall angle.

8. The method of claim 7, wherein the first sidewall angle is larger than about 55 degrees and the second sidewall angle is less than about 45 degrees.

9. The method of claim 1, wherein the first region is for forming n-type transistors and the second region is for forming p-type transistors.

10. The method of claim 1, further comprising:
forming an anti-punch-through region under the doped region.

11. The method of claim 10, wherein the doped region has a bottom portion overlapped with a top portion of the anti-punch-through region.

12. A method, comprising:
implanting a dopant into a substrate to form a doped region under a top surface of the substrate;
forming an epitaxial stack over the top surface of the substrate, the epitaxial stack including first semiconductor layers interleaved by second semiconductor layers;
patterning the epitaxial stack and a top portion of the substrate to form a fin-like structure;
depositing an isolation layer over sidewalls of the fin-like structure;
diffusing the dopant from the doped region into the isolation layer;
recessing the isolation layer to expose the patterned epitaxial stack;
removing the second semiconductor layers; and
forming a gate structure wrapping around each of the first semiconductor layers.

13. The method of claim 12, wherein a portion of the doped region is directly under the isolation layer.

14. The method of claim 12, wherein a top surface of the doped region is above a bottom surface of the isolation layer.

15. The method of claim 12, wherein the diffusing of the dopant includes performing an anneal process.

16. The method of claim 12, further comprising:
forming an anti-punch-through region under the doped region.

17. The method of claim 16, wherein the doped region has a bottom portion overlapped with a top portion of the anti-punch-through region.

18. A method, comprising:
forming a doped region in a substrate;
forming a fin protruding from the substrate;
depositing an isolation layer over sidewalls of the fin;
driving dopants in the doped region into the isolation layer;
recessing the isolation layer to expose the fin; and
forming a gate structure across the fin.

19. The method of claim 18, wherein after the forming of the fin, the doped region is exposed.

20. The method of claim 18, wherein the dopants are driven into a bottom portion of the isolation layer, and wherein during the recessing of the isolation layer, an etching rate of a top portion of the isolation layer and an etching rate of a bottom portion of the isolation layer is different.

* * * * *